US006989542B2

(12) United States Patent
Moses et al.

(10) Patent No.: US 6,989,542 B2
(45) Date of Patent: Jan. 24, 2006

(54) DEVICE AND METHOD FOR THE EXAMINATION OF SAMPLES IN A NON VACUUM ENVIRONMENT USING A SCANNING ELECTRON MICROSCOPE

(75) Inventors: Elisha Moses, Rehovot (IL); Ory Zik, Tel Aviv (IL); Stephan Thiberge, F-La Cell St. Cloud (FR)

(73) Assignees: Yeda Research and Development Co., Ltd., Rehovot (IL); El-Mul Technologies Ltd., Yavne (IL)

( * ) Notice: Subject to any disclaimer, the term of this patent is extended or adjusted under 35 U.S.C. 154(b) by 4 days.

(21) Appl. No.: 10/841,769

(22) Filed: May 6, 2004

(65) Prior Publication Data

US 2004/0217297 A1    Nov. 4, 2004

Related U.S. Application Data

(60) Division of application No. 10/448,313, filed on May 27, 2003, which is a continuation of application No. PCT/IL01/01108, filed on Nov. 30, 2001.

(60) Provisional application No. 60/250,879, filed on Dec. 1, 2000, provisional application No. 60/306,458, filed on Jul. 20, 2001.

(51) Int. Cl.
*G21K 5/08*  (2006.01)
*G01N 23/00*  (2006.01)

(52) U.S. Cl. .............. 250/440.11; 250/311; 250/441.11
(58) Field of Classification Search ........... 250/441.11, 250/440.11

See application file for complete search history.

(56) References Cited

U.S. PATENT DOCUMENTS

| | | | |
|---|---|---|---|
| 3,218,459 A | | 11/1965 | Bens |
| 3,378,684 A | | 4/1968 | Mentink et al. |
| 3,657,596 A | | 4/1972 | Goetze et al. |
| 4,037,109 A | | 7/1977 | Hosokawa et al. |
| 4,071,766 A | | 1/1978 | Kalman et al. |
| 4,115,689 A | | 9/1978 | Won |
| 4,308,457 A | | 12/1981 | Reimer |
| 4,448,311 A | | 5/1984 | Houser |
| 4,587,666 A | | 5/1986 | Torrisi et al. |
| 4,596,928 A | | 6/1986 | Dantilatos |
| 4,609,809 A | | 9/1986 | Yamaguchi et al. |
| 4,618,938 A | | 10/1986 | Sandland et al. |
| 4,705,949 A | | 11/1987 | Grimes, II et al. |
| 4,720,622 A | | 1/1988 | Iwata et al. |
| 4,720,633 A | * | 1/1988 | Nelson ....................... 250/310 |
| 4,880,976 A | | 11/1989 | Mancuso et al. |
| 4,912,330 A | * | 3/1990 | Flesner ....................... 250/352 |

(Continued)

FOREIGN PATENT DOCUMENTS

WO    WO-02/14830 A2    2/2002

OTHER PUBLICATIONS

Griffiths (2001) Trends in Cell Biology, 11(4) 153-154.

(Continued)

*Primary Examiner*—John R. Lee
*Assistant Examiner*—Paul M. Gurzo
(74) *Attorney, Agent, or Firm*—Darby & Darby

(57) ABSTRACT

A chamber suitable for use with a scanning electron microscope. The chamber comprises at least one aperture sealed with a membrane. The membrane is adapted to withstand a vacuum, and is transparent to electrons and the interior of the chamber is isolated from said vacuum. The chamber is useful for allowing wet samples including living cells to be viewed under an electron microscope.

10 Claims, 16 Drawing Sheets

U.S. PATENT DOCUMENTS

| | | | |
|---|---|---|---|
| 4,929,041 A | 5/1990 | Vahala et al. | |
| 4,929,831 A * | 5/1990 | Flesner et al. | 250/307 |
| 4,992,662 A | 2/1991 | Danilatos | |
| 5,097,134 A | 3/1992 | Kimoto et al. | |
| 5,103,102 A | 4/1992 | Economou et al. | |
| 5,122,663 A | 6/1992 | Chang et al. | |
| 5,250,808 A | 10/1993 | Danilatos et al. | |
| 5,323,441 A | 6/1994 | Torrisi et al. | |
| 5,326,971 A | 7/1994 | Theodore et al. | |
| 5,362,964 A | 11/1994 | Knowles et al. | |
| 5,406,087 A | 4/1995 | Fujiyoshi et al. | |
| 5,412,211 A | 5/1995 | Knowles | |
| 5,466,940 A | 11/1995 | Litman et al. | |
| 5,470,757 A * | 11/1995 | Gagnon et al. | 436/164 |
| 5,502,306 A | 3/1996 | Meisburger et al. | |
| 5,644,132 A | 7/1997 | Litman et al. | |
| 5,667,791 A | 9/1997 | Hersh et al. | |
| 5,789,748 A | 8/1998 | Liu et al. | |
| 5,811,803 A | 9/1998 | Komatsu et al. | |
| 5,859,699 A | 1/1999 | Baer et al. | |
| 5,898,261 A | 4/1999 | Barker | |
| 5,945,672 A | 8/1999 | Knowles et al. | |
| 6,025,592 A | 2/2000 | Knowles et al. | |
| 6,072,178 A | 6/2000 | Mizuno | |
| 6,114,695 A | 9/2000 | Todokoro et al. | |
| 6,130,434 A | 10/2000 | Mitchell et al. | |
| 6,157,446 A | 12/2000 | Baer et al. | |
| 6,452,177 B1 * | 9/2002 | Feldman et al. | 250/310 |

OTHER PUBLICATIONS

Davison & Colquhoun, J. Elec. Microsc. Tech. 2, 35-43, 1985.

Swift & Brown, J. Phys. E: Sci. Instrum. 3, 924-926, 1970.

Handley & Olsen, Ultramicroscopy 4, 479, 1979.

J.B. Steyn et al., "An Efficient Spectroscopic Detection System for Cathodoluminescence Mode Scanning Electron Microscopy SEM", Journal of Microscopy, vol. 107, Pt. 2, Jul. 1976, pp. 107-128.

Goldstein et al., Scanning Electron Microscopy and X-ray Microanalysis, Pleneum Press, New York, London, 1992.

Hoffman-Fezer et al., Annals of Hematology, 74, 231-238, 1997.

Ault K.A., et al., Exp Hematology, 23, 996-1001, 1995.

Feinerman & Crewe, "Miniature Electron Optics", Advances in Imaging and Electron Physics, vol. 102, 187, 1998.

Thomley, "New Applications of the Scanning Electron Microscope", Ph.D. Dissertation 3886, Corpus Christi College, Cambridge, 1960.

Sedar, A.W., Silver, M.J. and Ingeman-Wojenski, C.M., "Backscattered Electron Imaging to Visualize Arterial Endothelial Detachment in the Scanning Electron Microscope", Scanning Electron Microscopy, vol. II, 969-74, 1983.

Burns W.A. et al., "The clinician's view of disgnostic electron microscopy", Human Pathology, 6, 46-78, 1975.

Carlen, B. and Englund, E., "Diagnostic Value of Electron Microscopy in a Case of Juvenile Neuronal Ceroid Lipofuscinoisis", Ultrastructural Pathology 25, 285-288, 2001.

Hermann, R., Walther, P. and Muller, M., "Immunogold-labeling in Scanning Electron Microscopy", Histochem. Cell. Biol., 106, 31-39, 1996.

Kristiansen, E. and Madsen, C., "Induction of Protein Droplet (alpha-2 microglobulin) Nephropathy in Male Rats After Short-Term Dosage with 1,8-cineole and 1-limonene", Toxicology Letters 80, 147-152, 1995.

Tucker, J.A., "The Continuing Value of Electron Microscopy in Surgical Pathology", Ultrastructural Pathology, vol. 24, 383-9, 2000.

Gyorkey F. et al., "The Usefulness of Electron Microscopy in the Diagnosis of Human Tumors", Human Pathology 6, 421-441, 1975.

Fisher C. et al., "An Assessment of the Value of Electron Microscopy in Tumor Diagnosis", Journal Clinical Pathology 38, 403-408, 1985.

Hollinshead M. et al., "Anti-biotin Antibodies Offer Superior Organelle-specific Labeling of Mitochondria over Avidin or Streptavidin", The Journal of Histochemistry & Cytochemistry, 45(8), 1053-7, 1997.

Becker, R.P. and Sogard, M., "Visualization of Subsurface Structures in Cells and Tissues by Backscattered Electron Imaging", Scanning Electron Microscopy (II), 835-870, 1979.

Lehning E.J. et al., "Gamma-Diketone Peripheral Neuropathy", Toxicology and Applied Pharmacology 165, 127-140, 2000.

Gordon C. et al., "Risk Assessment of d-Limonene: An Example of Male Rat-Specific Renal Tumorigens" Critical Reviews in Toxicology, 24(3), 231-254, 1994.

Herrera G.A., "The Value of Electron Microscopy in the Diagnosis and Clinical Management of Lupus Nephritis", Ultrastructural Pathology 23, 63-77, 1999.

Grande JP et al., "Renal Biopsy in Lupus Nephritis", Lupus 7, 611-617, 1998.

McIntosh R.J., Electron Microscopy of Cells: A New Beginning for a New Century:, The Journal of Cell Biology, vol. 153, No. 6, F25-F32, 2001.

Harris L.G. et al., "Contrast Optimisation for Backscattered Electron Imaging of Resin Embedded Cell", Scanning Microscopy, vol. 13, No. 1, 71-81, 1999.

Garman R.H. et al., "Method to Identify and Characterize Developmental Neurotoxicity for Human Health Risk Assessment. II: Neuropathology", Environmental Health Perspective, vol. 109, 93-100, 2001.

Singer I. et al. "CCR5, CSCR4 and CD4 Are Clustered and Closely Apposed on Microvilli of Human Macrophages and T Cells", Journal and Virology, vol. 75, No. 8, 3779-3790, 2001.

Prescott-Mathews J.S., et al., "Methyl tert-Butyl Ether Causes alpha2u-Globulin Nephropathy and Enhanced Renal Cell Proliferation in Male Fischer-344 Rats", Toxicology and Applied Pharmacology, vol. 143, 301-314, 1997.

Weller P.F. et al., "Cytoplasmic Lipid Bodies of Neutophils: Formation Induced by cis-Unsaturated Fatty Acids and Mediated by Protein Kinase C", The Journal of Cell Biology, vol. 113, No. 1, 137-146, 1991.

Bozza P.R. et al., "Pathways for Eosinophil Lipid Body Induction: Differing Signal Transduction in Cells from Normal and Hypereosinophilic Subjects", Journal of Leukocyte Biology, vol. 64, 563-569, 1998.

Mittler, M.A., Walters, B.C. and Stopa, E.G., "Observer Reliability in Histological Grading of Astrocytoma Sterotactic Biopsies", J. Neurosurg 85, 1091-1094, 1996.

Spargo, B.H., "Practical use of Electron Microscopy Microscopy for the Diagnosis of Glomerular Disease", Human Pathology vol. 6, 405-450, 1975.

De Mets M. and Lagasse A., "An Investigation of some Organic Chemicals as Chathodoluminescent Dyes using Scanning Electron Microscope" Journal of Microscopy vol. 94, 151-156, 1971.

Goodpaster B.H., et al., "Skeletal Muscle Lipid Content and Insulin Resistance: Evidence for a Paradox in Endurance-Trained Athletes", The Journal of Clinical Endocrinology & Metabolism 86(12), 5755-5761, 2001.

Shulman G.I., "Cellular Mechanisms of Insulin Resistance", The Journal of Clinical Investigation, vol. 106, No. 2, 171-176, 2000.

McKinney W. and Hough Paul V.C., "A New Detector System for Cathodoluminescence Microscopy", Scanning Electron Microscopy, vol. I, 251-256, 1977.

Brocker W. and Pfefferkom G., "Applications of the Cathodoluminescence Method in Biology and Medicine", Scanning Electron Microscopy vol. II, 125-132, 1979.

Birks J.B., "The Theory and Practice of Scintillation Counting", Pergamon Press, 1964.

Hayat, M.A., "Principles and Techniques of Electron Microscopy—Biological Applications", Fourth edition, Cambridge University Press, 2000.

Hough P.V.C. et al., "Indentification of Biological Molecules in situ at High Resolution via the Fluorescence Excited by a Scanning Electron Beam", Proceedings of the National Academy of Sciences of the United States of America, vol. 73, No. 2, 317-321, 1976.

Moriki T. et al., "Activation of Preformed EGF Receptor Dimers by Ligand-induced Rotation of the Transmembrane Domain", J. Mol. Biol. 311, 1011-1026, 2001.

* cited by examiner

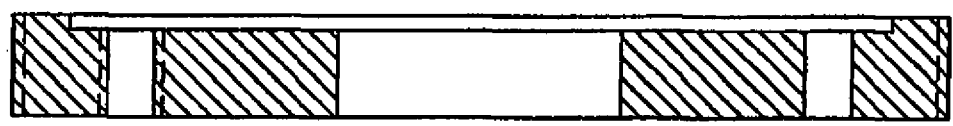
FIG.7E/1
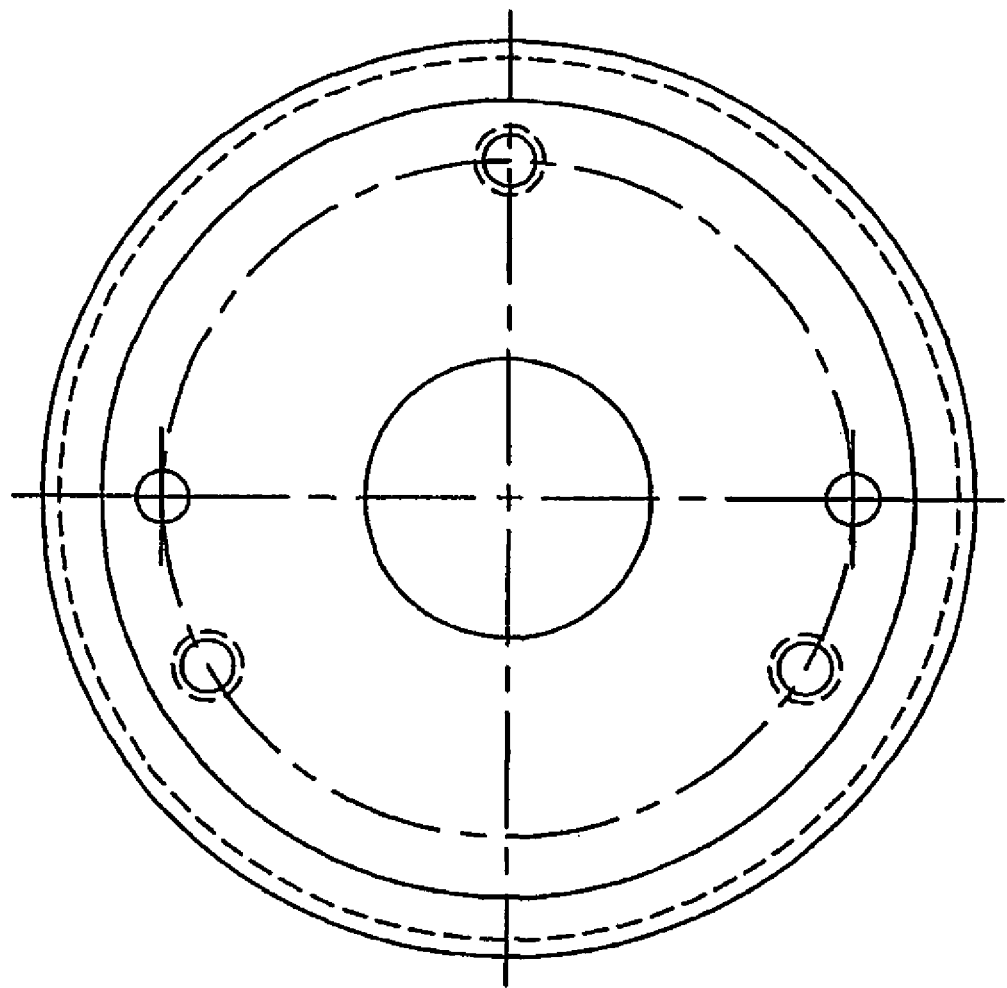
FIG.7E/2

DEVICE AND METHOD FOR THE EXAMINATION OF SAMPLES IN A NON VACUUM ENVIRONMENT USING A SCANNING ELECTRON MICROSCOPE

FIELD OF THE INVENTION

The present invention relates to a device and method for the examination of samples in a non-vacuum environment using a scanning electron microscope, and more particularly but not exclusively to the use of such an apparatus and method for inspection of objects in a wet environment.

BACKGROUND OF THE INVENTION

Optical microscopy is limited, by the wavelength of light, to resolutions in the range of a hundred, and usually hundreds, of nanometer. Scanning electron microscopes (SEMs) do not have this limitation and are able to attain a considerably higher resolution, in the range of a few nanometers.

One of the disadvantages of SEMs is that samples have to be maintained in vacuum, precluding the study of in-vivo processes or the study of wet materials. Furthermore, electrically insulating samples composed of organic materials require coating to avoid charge accumulation.

As early as 1960 a thesis by Thornley (University of Cambridge, 1960) disclosed unsuccessful attempts to maintain a sample intended for electron microscopy in an atmosphere of water vapor. A membrane is used to seal a chamber from the vacuum of the electron beam and the chamber itself has an inlet from a source of water vapor.

Attempts to use Electron Microscopy for living specimens go back as far as 1970. A paper by Swift and Brown (J. Phys. E: Sci. Instrum. 3, 924, 1970) disclosed the use of transmission electron microscopy (TEM) for examination of specimens at atmospheric pressure, for example in water. A cell having an aperture sealed with a collodion-carbon film is used to mount a sample. An electron beam passes through the aperture to strike the sample, and electrons not stopped by the sample continue to a scintillator where photons are produced. At atmospheric pressure the results were found to be "rather noisy" although a resolution of 0.1 $\mu$m was claimed.

U.S. Pat. No. 4,071,766 describes an attempt to use electron microscopy to see material in a non-vacuum environment, and refers to the inspection of living objects as "an ever-recurring problem". U.S. Pat. No. 4,720,633 describes a further attempt to use electron microscopy to see material in a non-vacuum environment. In both of these patents the electron beam travels through an aperture to a wet specimen. Neither of these attempts succeeds, however, in successfully viewing wet objects. The contents of both of these documents are hereby incorporated by reference.

A commercial product which attempts to solve the above problem is an Environmental Scanning Electron Microscope (ESEM), commercially available from Philips Electron Optics of Eindhoven, The Netherlands, which maintains a vacuum gradient along the electron beam path. However, the ESEM requires working with a sample at a critical point of water-vapor equilibrium, and requires cooling of the sample to around 4° C. Inspection of specimens at pressures of up to 5 Torr is said to be possible. However, so far there is no evidence that wet and/or living objects can be viewed at resolutions of 10 nm and below. Further information on this product and how it works can be found in U.S. Pat. Nos. 5,250,808, 5,362,964, and 5,412,211, the contents of which are hereby incorporated by reference.

A common method of achieving high resolution inspection of organic matter is Transmission Electron Microscopy (TEM). TEM requires specially prepared specimens having typical thicknesses in the range of 50 nm. A very high voltage is applied to create a parallel beam that passes through the sample. U.S. Pat. No. 5,406,087, the contents of which are hereby incorporated by reference, discloses a specimen holding device for use with a TEM. A specimen is sealed between two films that are able to transmit an electron beam. The interior of the device is filled with moisture and may be placed within the vacuum environment of the TEM. A very high energy beam travels through the specimen and surrounding fluid leading to a poor signal to noise ratio, as well as considerable damage to the sample.

The information made available by EM is usually unavailable by other techniques (reviewed in Griffiths (2001) *Trends in Cell Biology*, 11:4:153–154). The main reason for the prevalent underutilization of EM is the complexity of sample preparation, that is not only labor intensive and time consuming, but also raises concerns regarding the biological relevance of the results. The ability to carry out EM in an aqueous environment would obviate these problematic sample preparation steps.

At present, therefore, despite a long-felt need, there is no microscope that permits the study of wet samples at resolutions showing macro-molecular and molecular levels of detail. Such an ability is needed in fields as diverse as cell biology and polymer science as well as industries such as petroleum, food and microelectronics. In particular in the field of cell biology, such a microscope would enable analysis of cells leading to measurements of molecular level processes and also opening a whole new field in pharmaceutical drug discovery and diagnostic measurement. For example, such a microscope would allow detailed study and direct observation of interactions between drugs and living cells.

SUMMARY OF THE INVENTION

It is an object of the present invention to provide a chamber, adapted for use with a scanning electron microscope, that will enable electron microscopy of wet samples.

In accordance with a first aspect of the present invention there is provided a chamber suitable for use with a scanning electron microscope, said chamber comprising at least one aperture, which aperture is sealed with a membrane, said membrane being adapted to withstand a vacuum, and being transparent to electrons and wherein said chamber is isolated from said vacuum.

Preferably, the chamber is adapted to hold water or any aqueous medium including but not limited to cell culture medium, at substantially atmospheric pressure.

Preferably, the aperture sealed by the membrane, has a diameter within the range of 0.1 to 4 mm.

Preferably, the membrane has a thickness lying substantially within the range of 200–5000 Å, more preferably between the range of 500 and 2000 Å, and most preferably between the range of 500 and 1500 Å.

The properties required of the membrane, which constitutes a main element of the present invention, include the ability to withstand a pressure differential of approximately one atmosphere between the vacuum of the electron microscope and the environment contained within the chamber sealed by said membrane, while it is thin enough for energetic electrons to pass through and interact with the sample provided within the chamber. Any material with these attributes may be suitable for use in accordance with the principles of the present invention. According to currently preferred embodiments, the membrane material is selected from the group consisting of polyimide. polyamide, polyamide-imide, polyethylene, polypyrrole and additional conducting polymers, parlodion, collodion, Kapton, FormVar, Vinylec, ButVar, Pioloform, silicon dioxide, silicon monoxide, and carbon.

Preferably, a sample is placed in proximity, to the membrane. Alternatively a sample is mounted in contact with said membrane and this gives the advantage that the electron beam has to traverse a minimal distance through matter (as opposed to vacuum) to reach the sample. The membrane is preferably supported by a supporting grid placed between the membrane and a vacuum.

In general, the chamber is located in a vacuum whilst enclosing a sample within a fluid or at substantially atmospheric pressure or both. At least part of a wall of said chamber is resistant to a one atmosphere pressure gradient and is transparent to electrons having an energy greater than around 2 keV.

According to a second aspect of the present invention there is provided apparatus for high resolution inspection of an object in a chamber using a scanning electron beam, comprising a vacuum path for the electron beam and a vacuum-resistant barrier placed in association with the object, said vacuum resistant barrier being placed such as to isolate the object from the vacuum. The object may have thereon a fluorescent and an electro-luminescent marker, whereby a beam of electrons are able to excite photo-emission. The marker may be associated with a particular molecule of interest or the like and this method allows for light based images containing information about individual molecules. Such an embodiment preferably comprises an optical sensing unit and the chamber may be built as part of a light guide. The optical sensing unit may also comprise a photo-multiplier tube.

The optical sensing unit may be adapted to sense individual photons, and the apparatus is thereby adapted to sense light emissions resulting from the stimulation of single molecules.

The barrier or membrane may, in a more preferred embodiment, be any one of polyimide, polyamide, polyamide-imide, Kapton, FormVar and ButVar.

The barrier or membrane may be reinforced with a reinforcing grid placed between said membrane and said vacuum, and may have a thickness lying within a range of substantially 200 to 5000 Å, more preferably in the range of 500 to 2000 Å, most preferably in the range of 500–1500 Å.

Preferably, the barrier or membrane is placed across an aperture having a diameter substantially within the range of 0.1 to 4 mm. In a particularly preferred embodiment the diameter is substantially 1 mm.

The barrier or membrane is preferably transparent to energetic electrons, that is to say electrons having energies in excess of 2 keV or 3 keV.

According to one embodiment, the barrier is coated with a layer of a material having a high secondary electron yield, typically lithium fluoride.

In one embodiment, radical scavenger molecules are located in association with said object.

In one embodiment the object or sample is placed adjacent to or in contact with said vacuum-resistant barrier.

According to a third aspect of the present invention there is provided the use of a membrane, of which an exposed area having a diameter of 1 mm is resistant to a one-atmosphere pressure gradient, and which is transparent to high energy electrons, to construct a chamber to enable wet samples to be viewed under a scanning electron beam at a resolution substantially better than 100 nm.

According to a fourth aspect of the present invention there is provided a method of observing wet objects at nanometer range resolution comprising the steps of isolating a wet object in a chamber by separating said chamber from a vacuum chamber using a barrier, providing an electron beam to strike said sample from said vacuum chamber through said barrier, and observing at least one of secondary and backscattered electrons emerging from said chamber.

Preferably, barrier comprises a membrane selected to withstand a pressure of substantially one atmosphere and to be transparent to electrons having an energy in excess of around 2 keV.

Preferably, the wet object comprises a pharmaceutical composition.

Preferably, the wet object further comprises a living cell with which the pharmaceutical composition is interacting.

Preferably, said chamber comprises a fluid inlet and wherein the pharmaceutical composition is changed in respect of one of a group comprising concentration and type through the inlet dynamically during the observation.

BRIEF DESCRIPTION OF THE DRAWINGS

For a better understanding of the invention and to show how the same may be carried into effect, reference is now made, purely by way of example, to the accompanying drawings, in which:

FIG. 8 including

FIG. 10 including

FIG. 11 including

FIG. 14 including

DETAILED DESCRIPTION OF THE INVENTION

Figure 1:
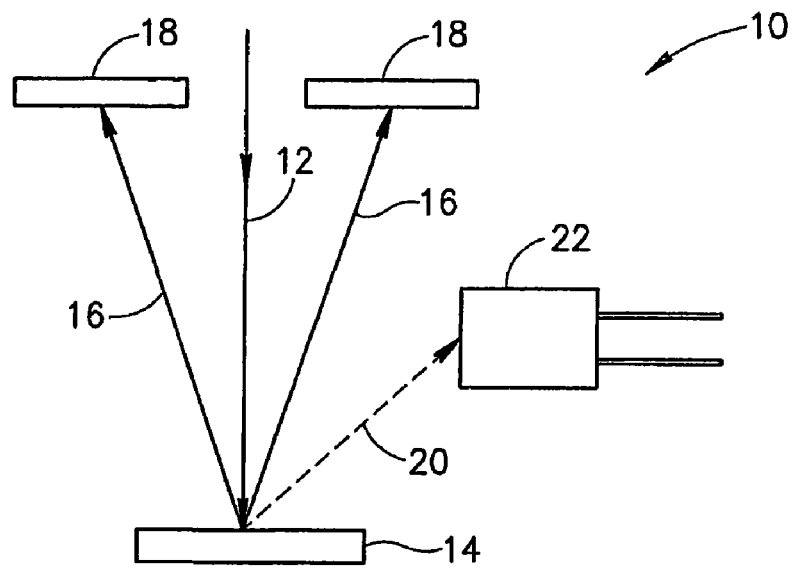
FIG. 1 is a generalized diagram showing a longitudinal cross-section of the sample area of a prior art scanning electron microscope.

The present invention provides a new technique of scanning electron microscopy that is adapted to the study of wet samples. The wet environment is provided in a small chamber enclosed by a membrane that is thin enough for energetic electrons to pass through and interact with the sample being studied.

We now disclose in detail both the technique and the mechanisms of signal formation in the imaging of samples in a scanning electron microscope through a membrane. We further disclose the mechanical and spatial setup and the properties required of the membrane, a main element in this method.

We disclose simple measurements for the characterization of the membrane, giving a guide to the choice of material and thickness. We further disclose the capabilities of the technique in imaging a variety of different samples. We evaluate the accessible contrast and resolution, and the current needed to obtain them. We show that it is possible to observe gold particles in water with a resolution of the order of 10 nm, while lower contrast materials may give significantly lower resolution on the order of 100 nm. This new technique may be adapted to numerous applications in diverse fields such as materials research and cell biology.

The present invention is based on the isolation of the fluid sample from the vacuum by the introduction of a membranous partition. Recent developments in polymer technology enable the production of thin membranes that are practically transparent to energetic electrons, yet are tough enough to withstand atmospheric pressures on one side and high vacuum on the other side. The imaged volume is within close proximity of the membrane, typically a few $\mu$m into the fluid. This is ideal for the inspection of objects that are at or adjacent to the membrane surface such as adherent biological cells. The techniques disclosed are furthermore easily adaptable to all existing Scanning Electron Microscopes, enabling measurements at room temperature and at atmospheric pressure.

A. The Experimental Setup

We have successfully applied the devices and methods of the present invention to work with both a JEOL 6400 SEM and a Philips ESEM in high vacuum mode, but the devices we present can be used with any SEM. Certain currently preferred embodiments of the present invention will be described below in full detail in relation to the accompanying drawings and figures.

The sample is held inside a chamber that is designed along the lines of a standard SEM sample mount insert. The main emphasis is on sealing of sample against the external pressure difference, and this is done with a series of o-rings. Closing the sample presents a hazard to the membrane, since considerable deformation would be caused if one were to try and compress the fluid inside the chamber as we close the sample with the membrane in place. To avoid this a small release channel is kept open through the stem of the insert, equilibrating the pressure inside by a slight release of fluid. The opening to this channel is subsequently sealed off with another o-ring that is screwed in place.

The membrane must have several important properties. First, it needs to be as transparent to electrons as possible. This implicates a low average atomic number (low Z) and a low density. Polymer films are therefore the most adequate choice.

Very good mechanical properties are also required of the membrane. While keeping thickness as small as possible to minimize scattering of the electrons before they reach the zone of interest, the membrane must resist a difference of pressure of one atmosphere for as large a surface area as may be required for observation. It must also be flexible enough to enable a considerable amount of handling in preparation of the sample, ruling our carbon films since they are very brittle. The porosity to the materials comprising the sample holder and inside the sample must be reduced as much as possible to ensure proper sealing of the chamber.

Ideally, the electrical conductivity of the membrane should be high enough to prevent the local charging of the external surface of the membrane, which may perturb the incident electron beam and blur the image. In practice we evaporate a thin carbon film on the outside of the membrane, thus eliminating charging effects.

Finally, the affinity of the membrane for the object observed may be an important factor. Typically in electron microscopes, the electrons go from the upper region to the bottom, so that the objects we would like to observe are located below the membrane. In the method developed, the best results are obtained when the objects are in close proximity to the membrane, and best when they are attached to it.

Different materials have been tested to build the membrane, all based on Carbon compounds. Formvar and Butvar, commonly used in TEM to build supporting films [Davison and Colquhoun, J. Elec. Microsc. Tech. 2, 35, 1985; Handley and Olsen, Ultramicroscopy 4, 479, 1979], and Polyimide have been tested. Of these materials tested to date only the last fully met all mechanical and sealing requirements. According to one currently preferred embodiment we use polyimide membranes of 1450 Å thickness supplied by Moxtex, Inc. Polyimide membrane show no measurable porosity to water: samples are placed in a vacuum of approximately $10^{-7}$ barr for several hours prior to insertion into the SEM, without detectable loss. They can resist the forces produced by atmospheric pressure in windows over 1 mm$^2$. To minimize this force on the membrane, and subsequent risk of rupture, the surface was usually reduced by the use of a TEM Ni grid that was attached to the external side of the membrane (125 to 330 $\mu$m mesh were used). For electrical conductivity, a carbon deposition of 50 Å on the external surface was found to be sufficient. Affinity properties, if required, are achieved by internal surface treatments.

B. Mechanism of Contrast Formation

There are two different contributions to the formation of a signal on the detector. The first is a source of uniform noise, while the second includes the signal:

1. When the beam hits the membrane, backscattered electrons (BSE) and secondary electrons (SE) are produced by the membrane itself. Only the SE produced in the first few nanometers (the mean free path of secondaries), can escape from the membrane [Goldstein et al., Scanning Electron Microscopy and X-ray Microanalysis, pp. 113, Plenum press, New York, London, 1992]. Their mean free path is around 1 nm in conductors (the thin carbon layer) and up to 10 nm in insulators (as are Polyimide and the fluid beyond it). The SE are created both in the membrane and in the carbon coating shield.

We therefore get a first contribution to the signal due to the membrane, comprised of both BSE and SE. This contribution is homogeneous since both the composition and the thickness of the membranes we use are the same everywhere. In the following, the subscript 'm' (for membrane) will refer to this contribution.

2. The portion of electrons from the beam which is not backscattered when crossing the membrane impinges upon the sample. Again, secondary electrons and backscattered electrons are produced.

The SEs produced here have no chance to escape, they would get stopped by either the membrane (an insulator) or the thin carbon coating shield (conductor). In contrast, BSE created in the sample have the possibility to exit back out through the membrane. As they cross the membrane, they may generate secondary electrons, which, if created at a distance from the surface which is below their mean free path, can escape to the detector.

Thus, we get this second contribution to the signal due to backscattering events in the zone of interest, which reach both the SE and BSE detectors. In the following, the subscript 's' (for sample) will refer to this contribution.

The second contribution (s) is obviously the contribution of interest. It carries the information we seek while the first is related to the membrane only (m). A contrast between two neighboring points will be observable if the difference in the sample signal between them is higher than the fluctuations in the membrane signal.

Our ability to form an image is thus determined by the possibility to obtain a large signal to noise ratio. This in turn is determined by the difference in backscattering coefficients of the materials located inside the sample ("material contrast"), and depends on the membrane as well.

Given two different materials for which the backscattering coefficients are known and for a specific membrane, we would like to determine the conditions we need to fulfill in order to form an image.

The total signal collected S is composed of both secondary electrons and backscattered electrons:

$$S \sim \epsilon_{BS}\eta + \epsilon_{SE}\delta \qquad (1)$$

$\eta$ and $\delta$ represent respectively the ratios of BSE and SE currents to the beam current. The coefficient $\epsilon$ represents the collection efficiency for the two kinds of electrons that are detected.

The backscattering coefficient $\eta$ is on its own made of two contributions: BSE from inside the membrane (m) and BSE from inside the sample (s), $\eta = \eta m + \eta s$.

Similarly, the SE scattering coefficient $\delta$ has two contributions, $\delta = \delta m + \eta s \, \Delta m$.

The difference is that while $\delta$ m represents the secondary electrons generated by electrons of the beam entering the membrane, $\Delta m$ represents the secondaries generated in the membrane by electrons on their way out, after a relevant backscattering event inside the sample.

The backscattering coefficient $\eta s$ thus multiplies $\Delta m$, because the flux of energetic beam electrons traveling back through the membrane is reduced from unity by $\eta s$.

Note that $\delta m$ and $\Delta m$ both describe emission of secondaries from close to the surface of the membrane. For $\delta m$, the high energy electrons generating the secondaries are for the main part the electrons of the incoming beam, with a small contribution from electrons that have backscattered inside the membrane. For $\Delta m$, the electrons generating the secondaries have experienced a backscattering event inside the sample. For this reason, $\Delta m$ can contain a slow material dependence. Depending on the material located below the membrane, the energy spectra of the BSE in this region can be different, and different energies of BSE may generate different SE emissions.

Note that the definitions of backscattering and secondary coefficients we use and the coefficients usually described in the literature differ slightly. The latter are defied for a semi-infinite medium and are characteristic of the material (Gold, Carbon, Nylon, etc.). Here, the coefficients describe the charge emission for a membrane with its particular thickness and its carbon shield. They do not describe the charge emission of a semi-infinite sample of polyimide material. In the same way, the sample coefficients describe the signal coming from the material inside the sample but covered by the membrane. One of our objectives in the following will be to relate experimentally the measured coefficient to the classical theoretical coefficients characteristic of the material itself (e.g. water, gold, etc.).

Let us consider two adjacent points that give signals SA and SB. The material contrast between them is defined as:

$$C_{AB} = (S_A - S_B)/S_A \qquad (2)$$

(assuming $S_A > S_B$).

There are two basic ways to modify the signal S. One is to multiply it by a constant (amplification). The other is to add a positive or negative constant to the signal (this is the "black level"). The contribution of the membrane to the signal is the same everywhere. Its thickness and its composition are very well defined. So that neither composition contrast nor topographic contrast appear between points A and B because of the membrane.

Contribution m is thus a constant that can be removed by an appropriate choice of the black level. Note, though, that noise on the order of pn where n is the number of electrons scattered from the membrane, may interfere with the measurement, but we ignore it for the moment, returning to it below. With this choice, the contrast between points A and B is greatly simplified:

$$C_{AB} = (\eta S_A - \eta S_B)/\eta S_A \qquad (3)$$

The material contrast is related only to the difference in the number of backscattering events occurring in the materials located below the membrane on points A and B.

Coming back to the contribution m, it generates a noise that may completely destroy the image if it is of the order of the amplitude of the signal generated by events inside the sample. For that reason, we have to study the membrane characteristics and quantify that portion of the signal that is related to the membrane only and was suppressed in the expression of the contrast (equation 3) by an appropriate choice of the black level.

C. Passage of Electrons Through the Membrane

We proceed now to quantify experimentally the contribution of the membrane to the signal. We do this in terms of BSE and SE emitted from its surface as a function of the energy. The method we employ is to measure the total current crossing the sample in different situations, then subtracting to obtain the losses into BSE and SE. We measure the current with no obstruction to estimate the full current that the SEM provides at the sample, and then measure the effect of the membrane on this current. Finally, we measure the current going through the membrane to a given material, in our case gold and water.

For this purpose we used four different samples and an assembly that allows the different samples to be inserted simultaneously inside the microscope (of the four samples we had, three could be inserted together, so we repeated the experiment with overlapping trios and identical conditions). For different energies, the beam was positioned successively on each sample and the current between the ground and the sample was measured.

Sample One is just a Faraday Cup [Goldstein et al., Scanning Electron Microscopy and X-ray Microanalysis, pp. 6. Plenum press, New York, London, 1992], used to measure the beam current $I_{beam}$ by collecting all the charge of the beam (a negligible quantity of charge can escape backward). It is constructed of a bulk of carbon connected to ground, with a cavity (2 mm diameter, 3 mm deep) at its top, closed by a Ni plate with an aperture of 10_m diameter in the middle. The beam enters through the aperture, hits the bottom of the carbon cavity, so that the main beam and practically all scattered electrons are collected.

Sample Two is identical in design except that the aperture is covered with a membrane. We call this measurement $I_{membrane}$.

Sample Three consists of a pure gold sample connected to ground and covered by a membrane. The gold was first melted so that its surface was smooth enough to obtain large areas where a 'direct' contact with the membrane was achieved. Finally, Sample Four is our experimental chamber, containing water and sealed by a membrane. Samples Three and Four define two values for $I_{material}+I_{membrane}$.

The difference of currents measured on Samples One and Two (normalized by that of Sample One) gives the percentage of electrons emitted by interaction with the membrane. This measures the contribution of the secondary and backscattering coefficients of the membrane:

$$[(I_{beam}-I_{membrane})/I_{beam}]=\eta_m+\delta_m:$$

The difference of the beam current (Sample One) from the currents measured on Samples Three or Four gives the percentage of electrons emitted from the sample that reach the outside. These include electrons that interacted with both the membrane and the material (either gold or water respectively):

$$[(I_{beam}-I_{membrane+material})/I_{beam}]=(\eta_m+\delta_m)+\eta_s(I+\Delta_m):$$

The subscript s refers to the material, here gold or water.

For energies below 5 keV, the gold and water curves are seen to superpose on the membrane curve. This means that the beam is not energetic enough to both reach the sample and send BSE back to the detector.

For energies above 5 keV, the three curves differ in their slope. A growing portion of the signal detected is due to interaction with the material considered. As the energy increases, this difference increases: the material component of the signal becomes dominant.

For the water sample and incident electrons energy of 10 keV, beam-membrane interactions contribute 50% of the charge emission. Their contribution decreases to 35% at 15 keV.

In the case of gold, because of its high atomic number, the proportion is dramatically smaller. At 10 keV, only 4% of the charges emitted are characteristic of the membrane. At 15 keV, the membrane contribution falls to 2%.

At this stage we can subtract the membrane component from the total electron emission, and obtain the material contribution to the signal. This includes only electrons that are scattered by their interaction with the material of interest.

At low energies the electrons of the beam do not reach the samples and the curves should be zero. At very high energy, the curves should follow the behavior of the backscattering coefficients of the materials, since the membrane becomes practically transparent. This is indeed what we observe on the two curves. The decreasing slope of the water curve follows the theoretical behavior of the backscattering coefficient, as calculated from Hunger and Kuchler's derivation [Phys. Status. Solidi A 56, K45, 1979; see also Goldstein op cit, p. 95]. The increasing slope of the gold curve also follows directly the calculated backscattering coefficient evolution with energy (as derived from the same expression).

By normalizing these curves by the backscattering coefficient of the respective materials (with their appropriate energy dependence), we get curves where only a low material dependence remains.

The results for water indicate a backscattering coefficient that is lower by about 25% than the theoretical curve predicted by Hunger and Kuchler. We are not sure what the origin of this difference is, but because our sample is completely enclosed with minimal chance of contamination, we believe that our experimentally determined value is the cleanest result available at this time for this quantity.

Though we have not measured this directly, the properties of the material below the membrane clearly affects also the energy spectra of BSE that are emitted. The energies range from 0 to $E_0$, where $E_0$ is the energy of the incident electrons. A light material (e.g. carbon) has a distribution that is approximately centered on the value $E_0/2$ and is symmetric [Bishop in Proceedings of the $4^{th}$ Intl. Conf. X-ray Optics and Microanalysis, edited by Hermann (Paris, 1966); see also Goldstein op cit., p. 100]. A heavy material (e.g. gold) has an energy distribution of BSE that is strongly asymmetric, with a peak closer to $E_0$. This difference induces two effects. First, the ratio of BSE that are able to cross back through the membrane to the total BSE produced is higher for heavy materials than for light ones. The membrane is actually acting to filter out the low energy BSE, thus enhancing artificially the contrast between light and heavy elements. Second, the difference in energy spectra of BSE can also influence the SE emission $\Delta m$ since low energy BSE have a higher probability to generate SE on their way out.

For other materials of atomic number between that of water and gold, the corresponding curve will lie between the two extremes shown. We summarize our conclusions from the results up to now as follows:

a) For energies below 4–5 keV, no signal from the sample can be detected. This threshold can be decreased by using thinner membranes.

b) The intermediate region of energies is interesting for several reasons: first, the membrane filtering effect on BSE of low energy enhances the contrast between heavy and light materials. Second, the emission of SE in this regime is important, and it is possible to image easily with the SE detector. The peak on the gold curve reaches a value higher than 1, demonstrating a high emission of SE.

c) For very high energies, the charges emitted approach the theoretically predicted BSE coefficients. The reason is that at higher electron energies (for both electrons of the beam and the backscattered electrons) the probability for BSE to cross the membrane is higher, and the probability to SE on their way out is lower. The secondary emission related to $\Delta m$ decreases and therefore, as observed experimentally, it becomes easier to image through the BSE detector.

The membrane filtering effect on BSEs becomes negligible at high energies. In the expression of the contrast (equation 3), the backscattering coefficients can be replaced by the back-scattering coefficients of the materials considered (water, gold, carbon etc.). The energy at which the plateau is reached shows the minimum energy above which this approximation becomes valid. For the membrane exemplified herein, this value is around 15 keV.

D. Deducing a Minimum Probe Current for Observation of a Given Material Contrast As soon as a small difference of composition (difference in the mean atomic numbers) exist between two points, it is theoretically possible to observe it. The question is how many electrons need to impinge on those points to make that observation.

Such an estimate is useful for several reasons. First, the current chosen influences the resolution: a high current causes the beam to be less focussed. This is more of a problem when the electron source of the microscope is a tungsten filament and is a less sensitive issue for a field emission microscope. Second, the electron source can only produce a limited number of charges, and third, high radiation doses can damage the specimen.

We are interested, in general, in samples containing liquids such as emulsions, biological specimens, polymer solutions, etc., which in most cases prove to be low contrast samples.

A somewhat arbitrary but useful criterion for sufficient visibility is the "Rose Criterion" [Goldstein op cit., pp. 215]. It states that, in order to observe a difference between two points A and B, the difference of signal amplitude between those points must be higher than 5 times the level of noise:

$$(S_A - S_B) > 5N.$$

Measuring the number of electrons that enter the detector when the beam is at point A at different scans, we get a distribution whose standard deviation is given by $\sim \eta^{1/2}$ and centered on a mean value $n$. The signal is thus proportional to $\eta$, and the noise to $\eta^{1/2}$. The signal to noise ratio is $S/N \sim \eta^{1/2}$ and the minimum level of material contrast that can be observed is $C_{min} = 5/\eta^{1/2}$.

Thus the mean number of electrons that must be collected in order to observe a specific material contrast C is given, in a general way, by $\eta > (5/C)^2$. The corresponding current (at the detector) is $I_s > (q/t)(5/C)^2$, where q is the electron charge and t is the time the beam is on each point, t can also be expressed as $t = T/n_p$ where T is the scan time and $n_p$, the number of pixels per frame. For a high-quality image, there are typically $n_p = 10^6$ pixels. Measuring $I_s$ in pico-Amperes and T in seconds, we find that the current required at the detector to obtain a given material contrast C is:

$$I_s > 4/TC^2 \qquad (4)$$

Finally, the signal current $I_s$ and the beam current $I_B$ are related through Is $= \eta s \ (\epsilon_{BS} + \epsilon_{SE} \Delta m) I_B$. An SE detector like an Everhart-Thornley detector is very efficient with good rejection of BSE [Goldstein op cit.]. The BSE detector does not collect SE and, because it has usually a small signature, has only medium collection efficiency. We found experimentally that at energies around 10 keV, both images in BSE and SE mode appear with the same contrast while at higher energies the BSE mode is better. Taking a reasonable estimate of the collection efficiency at 25% we get that the beam current required to obtain a contrast C is [19] (also in [Goldstein pp. 217]):

$$I_B > 16/\eta_s TC^2 (pA) \qquad (5)$$

At high energies, the contrast C is simply related by equation 3 to the backscattering coefficients of the materials below the membranes. Table I shows results of the calculation of the minimal current required for an observation of biological specimens such as a cell, an oil/water emulsion and a gold particle in water.

The four elements C, H, N and O make up nearly 99% of the weight of a biological specimen like a cell. The cell is composed of 70% water and 29% organic compounds. About 50% of the atoms in these compounds are H atoms, 24% are C, 24% are O, and 1% are N atoms [20]. Given these values, the mean atomic number of a typical organic molecule is 6.72. That of water is 7.22, and for a living cell, it is 7.07. Calculation of the corresponding backscattering coefficient at 20 keV give 0.075 for water, 0.073 for a cell. Thus, a cell surrounded by an aqueous medium presents a low contrast C=2:5%, and furthermore the backscattering coefficients are low. This calculation shows that a minimal current in the range of nano-Amperes is required for a typical scan of 100s.

TABLE I

Evaluation of the minimum current needed for an observation of different samples containing water. I is calculated from equation 5. The values for $\eta$ are calculated from the expression of Hunger and Kuchler at an energy E = 20ke V, using the mean atomic number values Z indicated. The scanning time T = 100 s is typical of a meticulous slow scan.

| material | Z | $\eta$ | contrast to water | I (pA) |
|---|---|---|---|---|
| water | 7.22 | 0.075 | — | — |
| Cells | 7.07 | 0.073 | 0.027 | 2900 |
| Oil | 5.8 | 0.055 | 0.267 | 30 |
| Gold | 79 | 0.78 | 0.90 | 0.25 |

An oil/water emulsion may be more easily observable and presents a contrast ten times higher: C=26:7%. The minimal current falls in that case to a few tens of pico-Amperes. For a gold particle immersed in water, the contrast is very high (C=90%). Imaging it requires only a fraction of a pico-Ampere (table I).

A biological sample such as a cell needs a high current to be imaged in a reasonable integration time. One can advantageously use labeling with heavy markers such as colloidal gold particles to decorate the cell. Emulsions of oil/water can be observed directly in standard conditions of current and integration time.

At low energies (10 keV and under) the influence of the membrane becomes important. As a consequence, low contrast samples need more and more current to be imaged.

E. Evaluation of the Resolution of the Technique

As in any electron microscope measurement, the question of resolution ultimately boils down to the existence of scattering atoms that have a high electron content. In the absence of strongly scattering atoms the beam will reach far into the sample, widening and losing resolution as it does so, before it undergoes enough interactions to be returned. In a material with high electron density, the beam travels only a short distance before being returned or absorbed, so the scattering volume is small and the resolution high.

To see the effect of the membrane on the resolution we need to evaluate the effective signal producing volume, characterized by a diameter $d_{eff}$ [Goldstein op cit., pp. 162]:

$$d_{eff} = (d_B^2 + d_m^2 + d_{BSE}^2)^{1/2} \qquad (6)$$

where $d_B$ represents the diameter of the beam entering the membrane. As the beam crosses the membrane, some scattering occurs, which is particularly important at low energy and tends to be negligible at high energy, $d_m$ represents the widening of the beam as a result of its interaction with the membrane—a beam with zero initial width $d_B=0$ will emerge from the membrane with diameter $d_m$.

The distance $d_{BSE}$ is the mean diameter of the volume covered by electrons in the sample before returning as BSE. $d_{BSE}$ can be found in the literature [Goldstein op cit. pp. 105], and is related to the Kanaya-Okayama (KO) range. Rescaling all characteristic lengths by the KO range removes a large part of the material dependence, leaving only a small atomic number Z dependence. In the case of a gold sample 90% of the BSE originate in a volume of diameter $d_{BSE}=0.3R_{KO}$. For carbon the same relation gives $dBSE=0.6R_{KO}$.

The KO range gives the typical size of the volume of interaction of the electrons inside the material. It is equivalent to the radius of a circle centered on the surface at the beam impact point whose circumference encompasses the limiting envelope of the interaction volume:

$$R_{KO}=0.0276(A/Z)Z^{0.11}E_0^{1.67}/\rho \quad (7)$$

$R_{KO}$ is expressed in $\mu$m, $E_0$ is the incident beam energy in keV, A is the atomic weight in g/mole, $\rho$ is the density in g/cm$^3$ and Z is the atomic number.

It is non-trivial to calculate the theoretical resolution in the general case of three different layers (carbon membrane-material). However, in the two limiting cases of materials with very low or very high atomic numbers such an estimate is possible.

A. Resolution of low contrast samples at low energy.

Light materials such as water, oil or the material composing the membrane, are close enough in atomic number so that a simple estimation would be to consider them as the same. Then, an estimate of the resolution is simply $$d_{eff}=(d^2_B+d^2_{BSE})^{1/2} \quad (8)$$

where $d_{BSE}$ is calculated in a mean light material. This evaluation makes sense as long as $d_{BSE}$ is larger than the membrane thickness.

The diameter of the beam $d_B$ depends on the electron source used in the microscope. A Field Emission source produces a beam of 1 nm size in the best conditions low current, high energy), while in the most difficult conditions, the size is around 10 nm. For a tungsten filament microscope, the diameter of the beam may vary from 10 to 100 nm.

Thus, the resolutions obtained in the case of light samples are on the order of 200 nm. At 10 keV, a low current and a Field Emission source, the estimation gives $d_{eff}$=170 nm while at 20 keV, it goes up to $d_{eff}$=500 nm.

Experimentally, we found that it is hard to obtain a resolution better than the membrane thickness. When lowering the energy, the resolution improves because the volume sampled below the membrane diminishes. But in practice, as the energy is decreased, the contrast decreases in a tradeoff. Less electrons are backscattered from the sample, and the ratio of the sample signal to membrane signal decreases. Thus, the real limit of resolution is given by the minimum contrast that can be detected. If one can reduce the thickness of the membrane then the minimum energy to image the sample will decrease and the resolution will improve significantly.

This estimate of the resolution indicates why at this stage, for low contrast samples like an oil in water emulsion, our technique does not improve much on optical microscopy. It can be improved by technical advances such as a thinner membrane. However, the situation completely changes when looking at gold particles in water, or more generally at small objects made of heavy material and immersed in a light material.

B. Resolution of high contrast samples at high energy.

The case of gold particles inside water is very interesting. The resolution obtained experimentally at high energy is in the range of few tens of nanometers. The higher the energy the better is the resolution obtained. Beads of actual diameter 40 nm appear to be around 50 nm diameter at 30 keV, over an order of magnitude smaller than the volume of interaction of BSE (given by dBSE). This demonstrates that the resolution is not related to the range of interaction. In this case, the resolution is linked to the diameter of the beam when reaching the depth of the particles.

At high energies the beam can diffuse inside the water if there is no bead to intercept it, and the volume sampled by the BSE is deep and wide (one to few microns). The signal that the BSE generate is the result of integrating over a very large volume and for this reason, does not vary significantly when the beam is scanned. Furthermore, at high magnification, when the image size itself is on the order of the size of the BSE sampled volume, this deep BSE signal is a constant that can be removed by an appropriate choice of the black level. On the other hand, when the electron beam crosses a heavy material bead, a significant part of the beam can be intercepted and immediately a lot more BSE are emitted (high backscattering coefficient). Thus, the resolution obtained is dependent on the spatial extension of the electron beam at the depth of the bead.

A bead that is located just below the membrane is imaged with the best resolution. The deeper the particle is inside the sample, the lower is the resolution at which it can be imaged.

The spreading of the beam is a problem that is well adapted to solution by Monte-Carlo simulations. We used a code devised by D. C. Joy [Monte Carlo Modeling for electron Microscopy and Microanalysis (Oxford University Press, New York, London, 1995)] to perform such a calculation. Input values for the simulation are the Polyimide stoichiometric formula $C_{22}O_5H_{10}N_2$, the mean atomic number 6:4 and the mean atomic weight 9.8 g/mol. The density of the material is 1.4 g/cc.

At 20 keV, the limit of resolution is estimated at 60 nm below the membrane. At 30 keV, the beam diameter calculated is 35 nm, a value compatible with the resolution obtained experimentally when the beads are in contact with the membrane.

The calculations show that if using a membrane twice thinner, imaging with 10 nm resolution is possible at high energies.

For beads located deeper inside the sample, one must take into account the spreading of the beam due the layer of water in between. An approximation of the resolution is given by $d_{eff}=\sqrt{(d^2_{beam}+d^2_{membrane}+d^2_{water})}$. $d_{water}$ calculated from Monte-Carlo simulations.

With the membrane used and at 30 keV, a gold particle located at 100 nm below the membrane can be imaged with a resolution of 45nm. A bead 200 nm deep can be imaged with a resolution of 80 nm with the same energy.

F. Sampling Depth.

For completeness, it is of interest to evaluate how deep a heavy particle can be detected inside the sample.

In a light material, almost 50% of the BSEs that escape reach a depth equal to $0.2R_{KO}$ before returning to the surface [Goldstein op cit., pp. 105]. The numerical coefficient 0.2 is for carbon, but it should be very similar for water and the material composing the membrane since the coefficient evolves very slowly with atomic number.

Taking that value as our estimated sampling depth, at 6 keV the sampling depth is around 150 nm. This value is compatible with our observation that imaging was hardly possible below this energy with our 145 nm thick membrane.

In water, the sampling depth is approximately 0.4 $\mu$m at 10 keV, 1.2 $\mu$m at 20 keV, and 3.1 $\mu$m at 35 keV, which is the maximum energy available on many scanning electron microscopes. These values give an estimate of the range of depths within which a gold particle can be detected inside water.

G. Estimation of Pressure Inside Chamber.

The following is a simple calculation of the pressure inside a wet chamber. The calculation mostly refers to the setup, where the chamber is assumed filled with water with only very little air inside (say, small bubbles).

To simplify the calculation the following assumptions are considered:

1. We start with a closed chamber, which is filled mostly with water at atmospheric pressure. We do have a small volume of air inside, $V_a$ measured in atmospheric pressure), which is small compared to the volume expansion, V, after putting the chamber in vacuum.
2. The membrane is modeled as a piston held by a spring with a spring constant k. This modeling is probably adequate since it only assumes a linear relation between the force on the membrane and the membrane's displacement, X. This effective constant is easily estimated experimentally. The surface area of the membrane (piston) is denoted by S.
3. Water is assumed to be incompressible. Once the chamber is put in vacuum the piston shifts until equilibrium is reached. The expanded volume, $V_e$, is determined by equilibrium condition and is filled by air and water vapor. The water vapor pressure, $P_{H2O}$, is determined by temperature only and is independent of the volume (see Kittley's Thermal Physics). Both air and water vapor are assumed to be ideal gases.

The number of water vapor molecules is given by:

$$N_{H2O} = \frac{P_{H2O} V_e}{RT} \quad (1)$$

where T is the temperature.

The total pressure in the chamber after insertion to vacuum is:

$$P_{tot} = \frac{N_{tot} RT}{V_e} = \frac{(N_o + N_{H2O})RT}{V_e} \quad (2)$$

where $$N_a = \frac{P_{atm} V_a}{RT}$$

is the number of air (nitrogen) molecules. In (1) and (2) we used assumption 1 that $V_e > V_a$.

Another equation for the pressure is given by the equilibrium condition:

$$P_{tot} S = \kappa X \quad (3)$$

using $V_e = XS$ we get an equation for the volume, $V_e$:

$$V_e = \frac{P_{tot} S^2}{k} \quad (4)$$

Putting (4) in (1) and (2) one gets after some manipulation an equation for $P_{tot}$ that depends on initial parameters:

$$P_{tot}^2 = \frac{P_{atm} V_a k}{S^2} + P_{H2O} P_{tot} \quad (5)$$

This equation can be transformed to (by dividing by the last term):

$$\frac{P_{tot}}{P_{H2O}} = 1 + \frac{P_{atm} V_a}{P_{H2O} V_e} \quad (6)$$

or to $$\frac{P_{tot}}{P_{atm}} = \frac{P_{H2O}}{P_{atm}} + \frac{V_a}{V_e} \quad (7)$$

Equation (7) is useful for the estimation of $P_{tot}$. The first term on the right is about 0.025. If the ratio on the second term is much smaller than this value then air bubbles can be neglected and the pressure in the chamber is the water vapor pressure. If it is larger then this ratio gives the fraction of the total pressure from atmospheric pressure. Note that this equation was derived with the condition that $V_e > V_a$. If $V_a > V_e$ then the pressure will stay close to atmospheric pressure and the water vapor pressure is irrelevant.

DESCRIPTION OF THE PREFERRED EMBODIMENTS

Reference is now made to FIG. 1, which is a generalized diagram showing a longitudinal cross-section of the sample area of a prior art SEM 10. A primary electron beam 12 travels through a vacuum path to reach a sample 14. It strikes the sample 14 to form a stream of backscattered electrons 16, which strike a backscattered electron detector 18. In addition to backscattered electrons, secondary electrons 20 emitted by the sample are accelerated towards a secondary electron detector 22.

The mean free path of an electron through the atmosphere is very small and thus the entire electron path, from an emitter via a sample to a detector, is in a vacuum, making it impossible to study wet samples or in-vivo processes.

Figure 2:
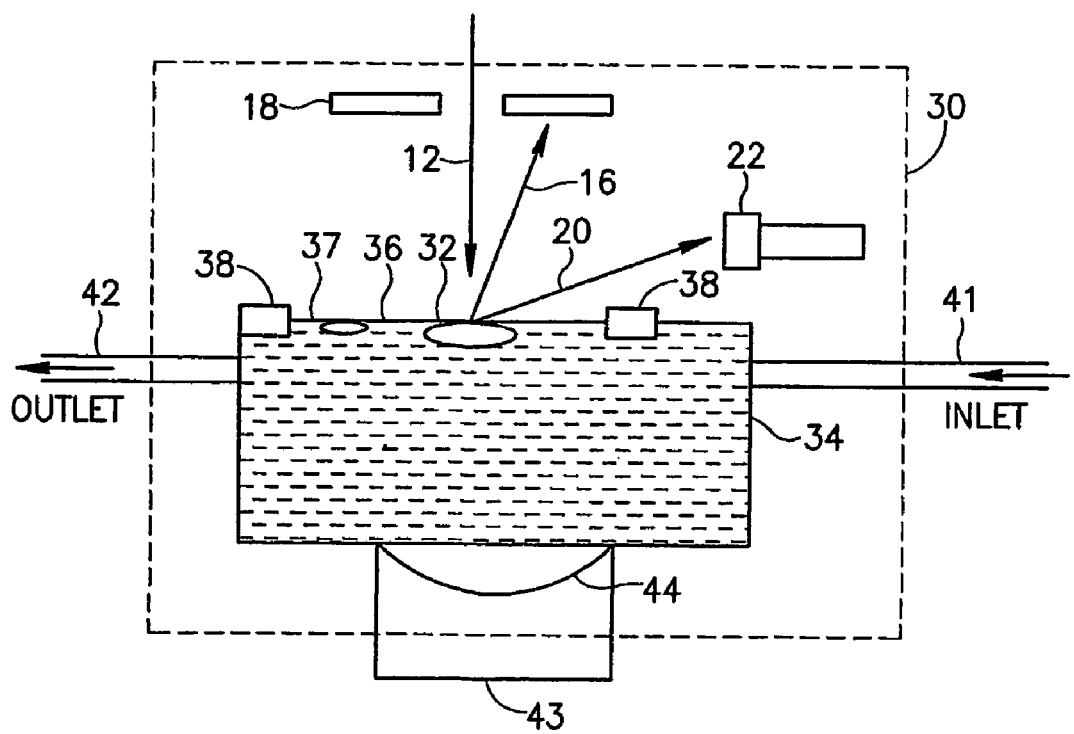
FIG. 2 is a generalized diagram showing a longitudinal cross-section of a scanning electron microscope incorporating a chamber according to an embodiment of the present invention.

Reference is now made to FIG. 2 which is a generalized diagram showing a longitudinal cross-section of a scanning electron microscope according to a first aspect of the present invention. Parts that are the same as those shown in the previous figure are given the same reference numerals and are not described again, except as necessary for an understanding of the present embodiment.

In FIG. 2 a primary electron beam 12 travels through a vacuum chamber 30 towards a sample 32 which is placed within a chamber 34. Sealed within the chamber 34 is an atmosphere suitable for the retention of wet and living tissue, in which atmosphere in-vivo processes are able to take place. The most suitable environment will comprise an aqueous medium.

In order to seal the chamber from the vacuum chamber, a barrier 36, typically a membrane, is stretched across an aperture defined by a ring 38. The ring 38 is designed to hold the membrane 36 at its ends in an airtight fashion as will be shown in greater detail in connection with FIG. 3 below. The sample 32 is preferably placed close up to the membrane 36 so that the electron beam does not have to travel through the atmosphere within the chamber in order to reach the sample. In a preferred embodiment, the sample 32 is in actual physical contact with the membrane and in the case of living tissue, may be grown on the membrane or attached thereto using known methods, as will be exemplified hereinbelow.

Preferably, the chamber 34 comprises a relief outlet 40, which will be discussed in detail in connection with FIG. 3 below. It further comprises an inlet 41 and outlet 42 for fluids that maintain the appropriate conditions for the specimen. For example. it is possible to utilize the inlet 41 and outlet 42 to change the chemical environment of the specimen being studied. This feature is particularly useful in the study of drugs, where it is possible to watch the dynamic reaction of a cell as the concentration of a given drug is changed.

The membrane 36 may be a foil or a film and should preferably be able to withstand pressure gradients of up to one atmosphere whilst at the same time being transparent to an electron beam. In one exemplary embodiment, a layer of polyimide substantially 1500 Å thick is used as it can withstand the pressure gradient an is transparent to electron beams having energies in the region of 3 keV and above. Thinner membranes are transparent to 2 keV. More generally the thicknesses may lie within a range of 200–5000 Å in order to withstand the necessary pressure gradient and at the same time be transparent to electrons at the beam energies available. Preferred materials are polyimide, for example of molecular formula $C_{12}H_{12}N_2O$, polyamide, polyamide-imide, polyethylene, polypyrrole and additional conducting polymers, parlodion, collodion, silicon dioxide, silicon monoxide, carbon and trademarked materials including Kapton™, FormVar™, Vinylec™, Pioloform™ and ButVar™. A membrane composed of polyimide as described above allows for the passage of the primary beam and the resulting backscattered electrons 16.

Secondary electrons (SEs) generally have lower energies than those discussed above and would normally tend to be absorbed in the water. Thus SEs that are emitted from the sample are not normally detected. However, in a preferred embodiment, the SE signal is enhanced by coating the membrane with one or more layers 37 of material having a high secondary electron yield. Typical materials include lithium fluoride.

As will be appreciated, the SEs are detected by the SE detector 22 and thus serve to enhance the overall signal.

In a preferred embodiment, the diameter of the exposed area of the membrane 36 within the aperture is substantially 1–3 mm. The membrane is typically supported on a grid, each opening within the grid having a maximum diameter of substantially 0.1 mm. The grid enhances the ability of the membrane to withstand a pressure gradient. The grid is schematically shown in FIG. 3.

The membrane preferably permits the maintenance of normal atmospheric conditions within the chamber 34, and thus permits the inspection of a range of samples that includes living cells, organelles or parts thereof, and proteins. It further allows the inspection of surfactants, colloids, oil particles, emulsions, and polymeric or micellar solutions. In the pharmaceutical industry the chamber can, for example, be used to examine dynamic properties of drugs, such as swelling, dissolution and disintegration and even the resistance of cells to certain drugs. In the textile industry the chamber may be used for investigating the wetting and drying of wool, cotton and synthetic fibers. Other fields to which the invention is applicable may include petroleum, food, geology, microelectronics, paper coating and materials science.

The chamber 34 itself can be filled with a gas or a liquid as desired and the samples can be monitored at the molecular level due to the nanometer range resolution of the electron beam. The resolution loss due to the membrane is negligible since there are very few scattering events which occur therein. When the chamber is filled with gas, a pressure relief device, preferably comprising a spring 43 and an additional membrane 44, may be provided in the chamber to prevent the membrane 36 from bursting.

The chamber 34, in accordance with embodiments of the present invention may be incorporated into standard SEMs, as discussed below in respect of FIG. 3. The chamber 34 is compatible with standard specimen holders or specimen mounts. The specimen holder is designed according to the dimensions of standard commercial specimen holders so that it can be incorporated with ease into the specimen chamber, that is, the enclosure of the microscope for placement of the specimen holder.

Although, in the above, the chamber has been described as containing atmospheric pressure, this is not necessary for all samples and in certain cases lower pressures may be found to be suitable, hence reducing the pressure gradient across the membrane 36.

A difficulty in using an electron beam to observe a living cell or an in-vivo process is that the electron beam itself damages the sample. Peak damage to DNA, for example, occurs at 4 keV. The choice of 3 keV/1500 Å polyimide membrane is safety below the peak damage level.

The damage level can further be optimized by finding an energy level which minimizes damage to the individual sample.

Figure 3:
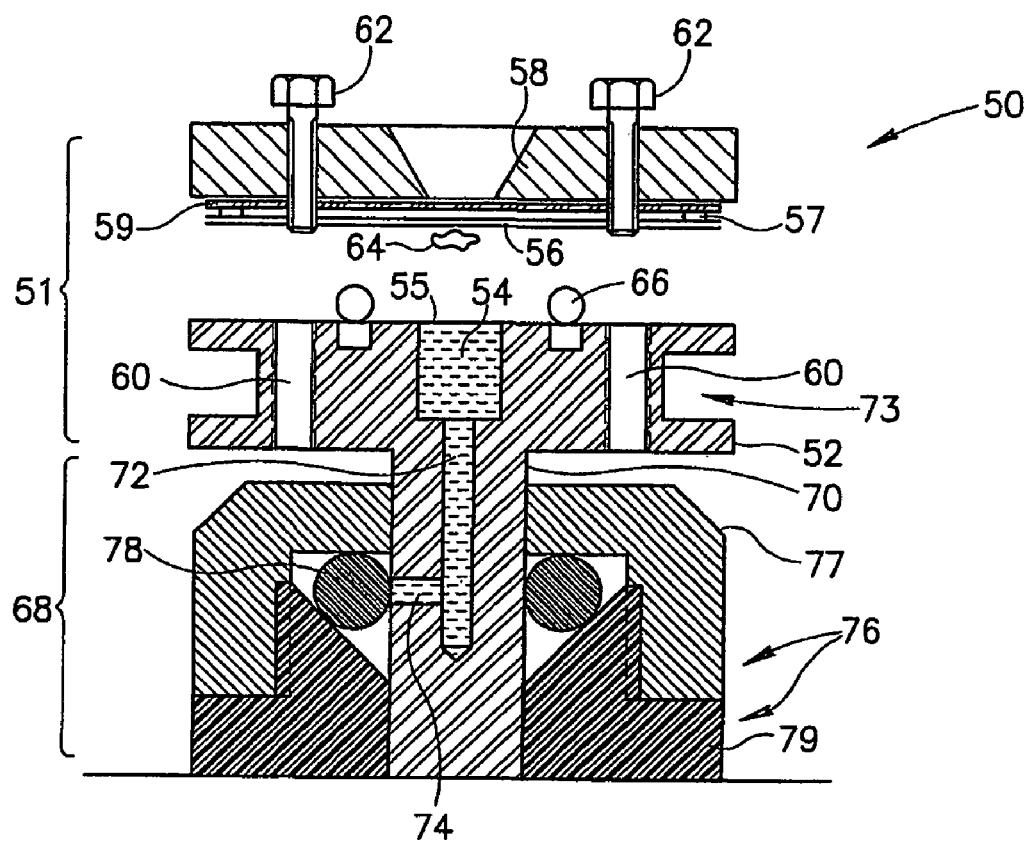
FIG. 3 is a generalized cross-sectional diagram of a chamber according to one embodiment of the present invention.

Reference is now made to FIG. 3, which is a simplified slightly exploded cross sectional diagram of a further embodiment of the chamber of FIG. 2, showing greater detail. A chamber 50, preferably of a size which fits into a conventional sample holder, comprises a sample holding assembly 51, which in turn comprises a body member 52 enclosing a sample region 54 having an open surface 55. In the example of FIG. 3 the body member 52 is a standard SEM specimen mount. The sample region is enclosed by a membrane 56 of the type described above which is fitted over the exposed side of the sample region 54. A grid 59 is situated above the membrane and separated therefrom by a spacer 57. A closing member 58 fits over the body member 52 in such a way as to grip the membrane 56 around its edges. The closing member is attached to the body via threaded screws 62 which fit into corresponding holes in the enclosing members 58, which holes are continuous with threaded holes 60 in the body member 52. In order to provide hermetic sealing of the sample region 54, an O-ring seal 66 is fitted in the body member 52 around the sample region 54.

A sample 64 is shown in close proximity with the membrane 56. Preferably, it should be either in actual contact with the membrane or within nanometers thereof so that the electron beam does not have to travel through any significant quantity of atmosphere.

When the sample region is sealed by tightening of the screws 62 there may be a build-up of pressure within the sample region. There is thus provided a pressure-relief assembly 68 allowing for escape of excess fluid. The assembly 68 comprises a stem 70 enclosing a channel 72. Channel 72 connects the sample region 54 with a further opening 74 at the far end of the stem 70. Around the stem 70 is a sliding cylindrical closing member 76 comprising an upper part 77 which fits over a lower part 79 to press it inwardly against a second O-ring seal 78. The closing member 76 is preferably used to seal the opening 74 only after the sample region itself has been sealed, thus allowing a path for the excess fluid of the sample-holding assembly 51.

Inserts 73 allow for insertion into a sample holder (not shown).

Figure 4:
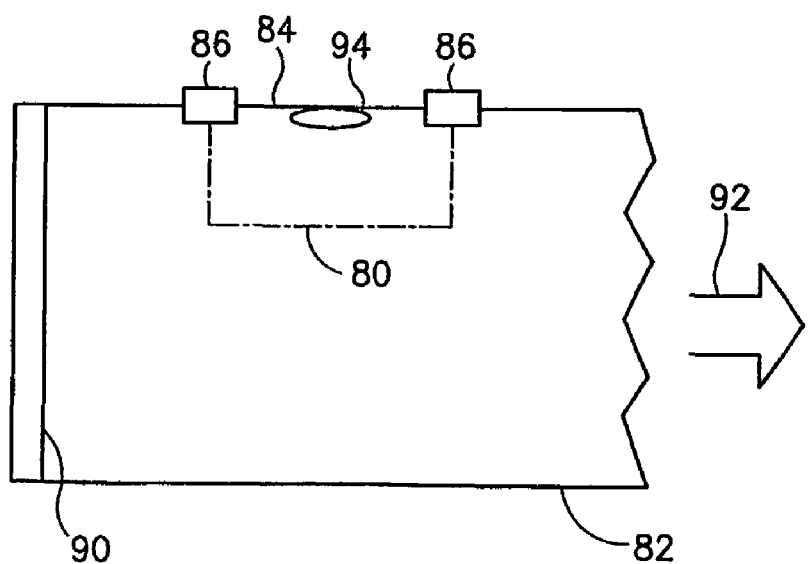
FIG. 4 is a generalized cross-sectional diagram of a chamber according to another embodiment of the present invention, embedded within a light guide.

Reference is now made to FIG. 4, which is an embodiment of the chamber of FIGS. 2 and 3 adapted for additional sampling by optical means. In FIG. 4, a chamber 80 is produced as part of a light guide 82. A membrane 84, held by closing member 86, seals the chamber 80 from the vacuum. A reflective coating 90 preferably coats one end of the light guide 82, the other end leading in the direction of arrow 92 to a photomultiplier tube (not shown). A sample 94 is marked with an electro-luminescent (fluorescent) marker which is excited by the electron beam. The light is deflected in the direction of arrow 92 to be amplified by the photomultiplier tube (not shown). Thus it is possible to detect single photons, and there is preferably provided a means for optical detection at the nano-scale resolution of SEM.

Figure 5:
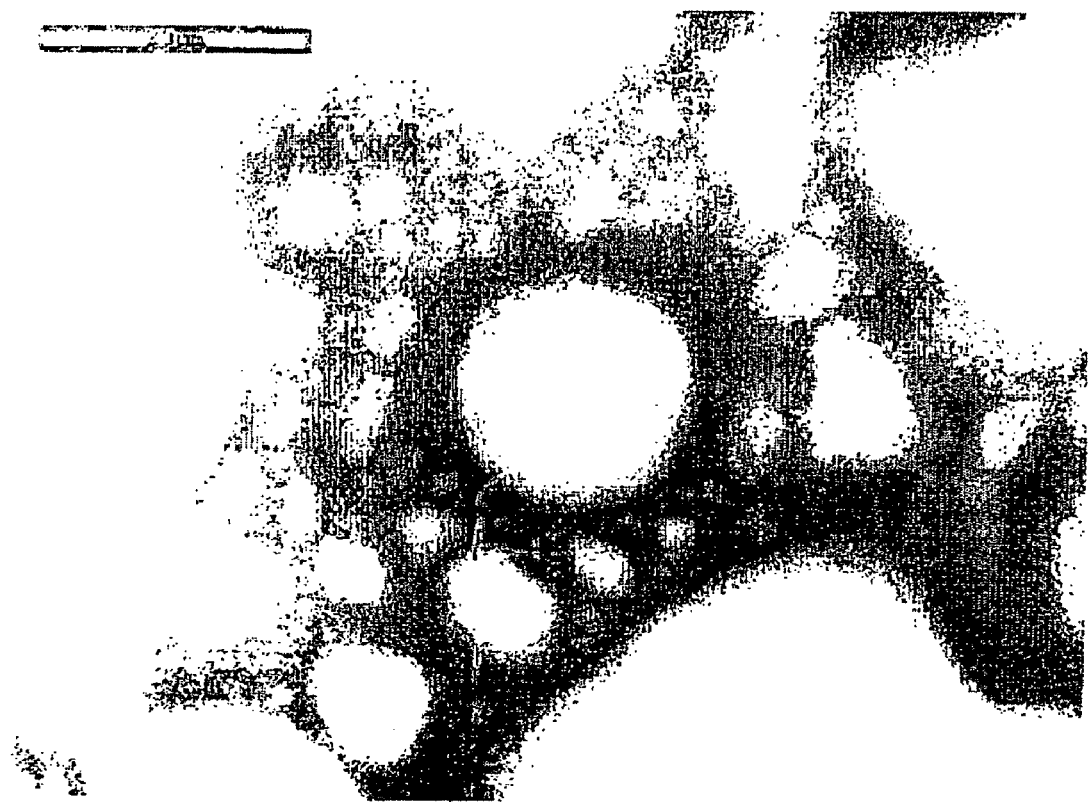
FIG. 5 is an electron micrograph taken using the embodiment of FIG. 3.

Reference is now made to FIG. 5 which is an electron micrograph showing a wet specimen inspection using the embodiment shown FIG. 3. The sample is an oil-in-water emulsion as used in a previous experiment to demonstrate ESEM contrast, described by Matthews (Proceedings of the Institute of Physics. EMAG99, page 95. Sheffield, 1999), the contents of which are hereby incorporated by reference. The electron micrograph was taken with a JEOL 8400 SEM having low resolution, and a scale marker is shown. The resolution obtained using a membrane in accordance with the present invention is virtually the same as the resolution level achieved using the SEM in the conventional manner without a membrane. Good contrast is obtained and the overall results are sufficient for wet specimen inspection.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

DETAILED DESCRIPTION OF PREFERRED METHODS OF THE INVENTION

Ideally, a technology for imaging wet samples including but not limited to viable unfixed cells should deliver the following capabilities:

1. Imaging properties:
Resolution of at least 100 nm, preferably in the range of 1–20 nanometers High signal to noise and signal to background ratios
2. Physiological Environment of the Cell:
Ability to work in the wet environment of the wet unfixed cell Minimal radiation damage (minimal interference to imaging, minimal effect on the biologically relevance of the results)
3. Throughputs:
Minimal sample preparation steps.
Automation Strategy The current invention is based on a Scanning Electron Microscope, which we modify to meet the specifications outlined above.

Minimal Sample Preparation Steps

Classical SEM procedures requires coating of the sample to prevent its charging. Here the aqueous electrolyte solution (medium) surrounding the cells is enough to prevent charging. Thus, sample preparation does not require coating, and allows working with living cells. The fact that sample preparation does not require fixation, de-hydration or coating, drastically shortens and simplifies sample preparation procedures compared to conventional SEM, and significantly enhances the quality of the results. Here is a sample preparation procedure as a non-limiting example. This example is suitable for labeling extracellular cell components, like the extracellular portion of membrane proteins. Other labeling techniques including labeling of intracellular cell components, are described in the examples section below. Labeling cells is done by the regular immunolabeling procedures.

Our results demonstrate that this wet SEM technique is suitable for both fixed and living cells, and for both adherent and non-adherent cells. Furthermore, these results demonstrate that while labeling is needed to have single molecule detection, cells may be imaged without labeling.

Automation Strategy.

The current invention also solves the low throughput of laboratory SEMs. It utilizes for biological samples the SEM automation developed for the semiconductors industry for wafer-inspection. This idea of utilizing in biology the SEM automation developed for wafer-inspection is described at length in copending PCT application, entitled "Method of identification and quantification of biological molecules and apparatus therefore" (PCT/IL01/00764) There, the samples are dry, allowing for straightforward usage of a Wafer Inspection Scanning Electron Microscope (WISEM) or WISEM-like microscope. This idea could not be applied to biological samples obtained in their natural aqueous environment, because preparation of such samples to be compatible with the vacuum requirements of conventional electron microscopy, including WISEM, impose drastic and complicated steps that feasibly prevent automation. The current invention enables imaging of aqueous samples, without the need for these problematic sample preparation steps. Thus, allowing the utilization in biology the SEM automation developed for the semiconductors industry for wafer-inspection. This utilization will greatly reduce the cost of instrumentation required to implement the method.

The automation strategy is a set of guidelines describing the procedures to be used in an automated imaging of live cell samples with the WET SEM technology. In a preferred embodiment of the invention the automation procedure will include: A 'cell chip' containing a large number of isolated chambers where each chamber contains a sample prepared for wet SEM imaging. Each such subdivision (isolated chamber) contains a partition membrane on which cell samples (which may be identical or different) are grown. Standard automated fluid control can be used in the preparation of the samples.

Once the cell chip is ready for imaging it can be taken to an automated optical imaging (or alternatively low magnification SEM scan) using standard optical microscopy or special setup, like optical fiber etc., integrated into the SEM. This scan will provide an overview image of the cells in each chamber, their position and any other information relevant for the experiment. The information on the cells in this scan will be detected automatically using specifically developed algorithms.

The partition membrane is mounted on a metal grid for mechanical stability. The grid supplies a convenient, extremely stable reference for the coordinates of every image.

In the case where an optical scan is performed outside the SEM, the cell chip is transferred to the SEM chamber for the SEMart imaging. Alignment algorithms will be used to match between the coordinate systems of the optical microscope and the SEM.

Once these two coordinate systems are matched the SEM will image specific regions of interest (ROI) chosen automatically from the optical scan (or the low magnification SEM scan). Such ROI can include a specific region within a cell where important biological activity takes place or a region that is related to a specific sublocalization in the cell or a region which provides a statistical representation of other regions in the cell. The gold colloids are to be imaged in each such region.

Such ROI can have different size hence requiring different magnification of the SEM. Note that there is a trade off between the field of view imaged and the size of labeling that can be observed. Hence, different size of labeling will be required for imaging at different field of view. Specifically, for an image of a whole single cell a large field of view is required. Such a large field of view means low magnification and ability to observe only large gold colloids (depending on the resolution of the scan). Alternatively, many small field of view images taken at higher magnification can be combined to provide a high resolution picture of the whole cell.

SEM images are taken automatically. This includes automated positioning of the SEM stage automated focus and astigmatic corrections, automated brightness and contrast.

Images taken by the SEM may be analyzed automatically using image analysis algorithms. This includes identification, counting and comparison of the position and size of gold colloids observed.

Other signals can also be measured in the SEM imaging. These include signals from cathodoluminescent markers (as exemplified hereinbelow) or X-ray emission from the sample which can provide analytical chemical analysis of the samples.

While one cell chip is scanned with SEM another can be scanned optically.

Very High Resolution Optical Imaging in the SEM

A very interesting option is to use the narrow electron beam to excite light emission in the sample. Such light emission is called cathodoluminiscence (CL) and has been studied on dehydrated samples in the past (reviewed by Hough PVC. Scanning electron microscopy I, 257, 1997). This will enable detection of light emission with a resolution much better than the theoretical limit in light microscopy. This solution combines the high resolution of SEM imaging with the familiar fluorescent labeling. This option is highly advantageous when wet and living samples are imaged in the SEM. In this imaging system the electron beam produces secondary electrons (SE) emission that excite CL (fluorescent) labeling molecules that, in turn, emit visible light. This emitted light is then collected in a collection pathway separate from the usual electron detection. Excitation by secondary electrons can be shown to be equivalent to broad band UV radiation (see Hough PVC, Scanning electron microscopy I, 257 1977). The advantages of this method are numerous:

1. The combination of both fluorescent and gold labeling has many biological advantages
2. Getting a high resolution image of labeled molecules can provide new and important biological information.
3. Single photon detection is easily managed and assures recovery of a sizable fraction of the photons emitted
4. The availability of DNA-encoded fluorescent proteins opens new labeling opportunities for electron microscopy.
5. Unique probes such as quantum dots and fluorescent beads can be used as markers in this technique providing versatility and advantages unattainable in other techniques.

The embodiment of the wet-CL apparatus may be based on existing CL detectors or may involve the development of novel collection geometries and configurations. Existing detectors are, for example, those that collect light from the upper half plane (above the sample). In this mirror configuration an ellipsoidal mirror is placed above the sample, with a small hole in it to allow the passage of the electron beam. Light is collected by the mirror and directed towards a window in the microscope, beyond which a photon detector is situated. Such a collection configuration can be obtained commercially, for example from Gatan (previously Oxford Instruments). Below we detail two exemplary configurations for collection in the lower half plane, in which photons are collected below the sample, and directed by light guides to a detector outside the microscope.

The apparatus is made as follows: The sample chamber (made of stainless steel) is closed on the upper part by the partition membrane and on the bottom part by a small lens so that the membrane is located at the focal plane of the lens. Thus, the light emitted in the close proximity of the membrane and collected by the lens comes out collimated when leaving the lens. The sample chamber is put inside a stage where a prism redirects the light coming out of the lens at 90 degrees (i.e. horiziontally).

The stage also contains a lens, which is used to refocus the light at the entrance of an optical fiber. The optical fiber leads from the stage to a detector located outside the microscope. The detector used is single photon module detection system. For each photon detected, the output signal is a TTL signal (0–5V square signal).

The output of the detector is connected to a computer card, which counts the number of TTL signals (photons) received. The computer card receives also several signals from the microscope: beginning of an image acquisition; beginning of a new frame beginning of a new line. Using appropriate software specially designed, the image is reconstructed in real-time from the collected data.

Figure 6:
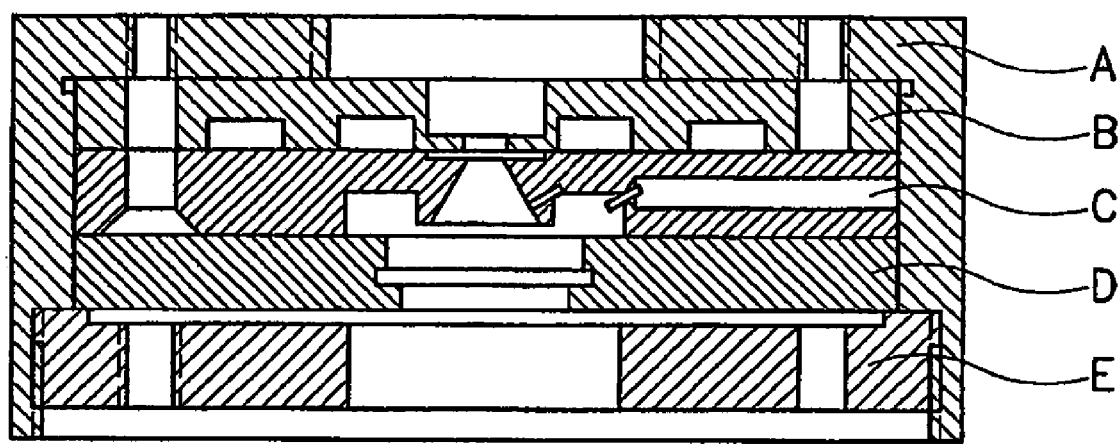
FIG. 6 is a diagram of an assembled sample chamber unit for fluorescence.
Figure 7A:
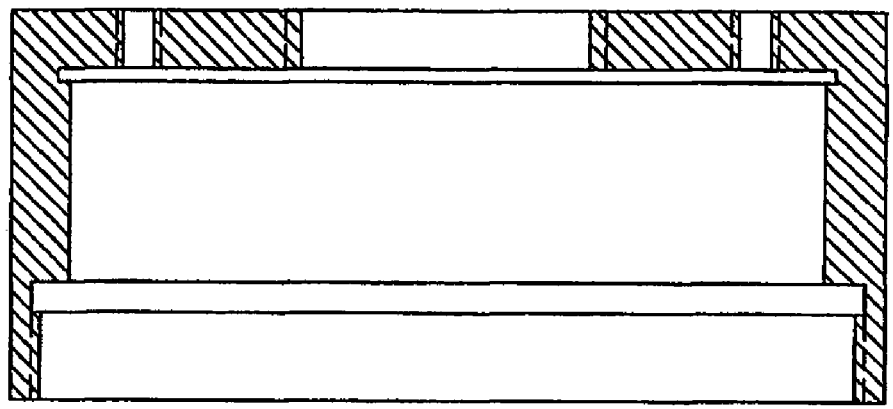
FIG. 7 containing FIGS. 7A, 7B, 7C/1, 7C/2, 7D, 7E/1 and 7E/2 depicts diagrams of components A–E of the chamber of FIG. 6.
Figure 7B:
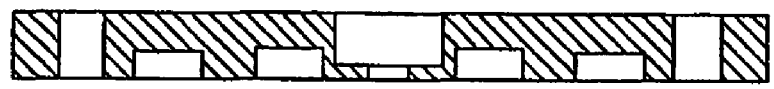
Figure 7D:
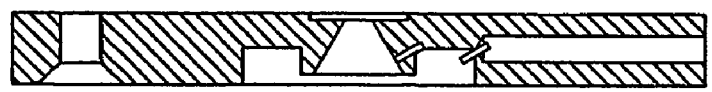
Figure 7D:
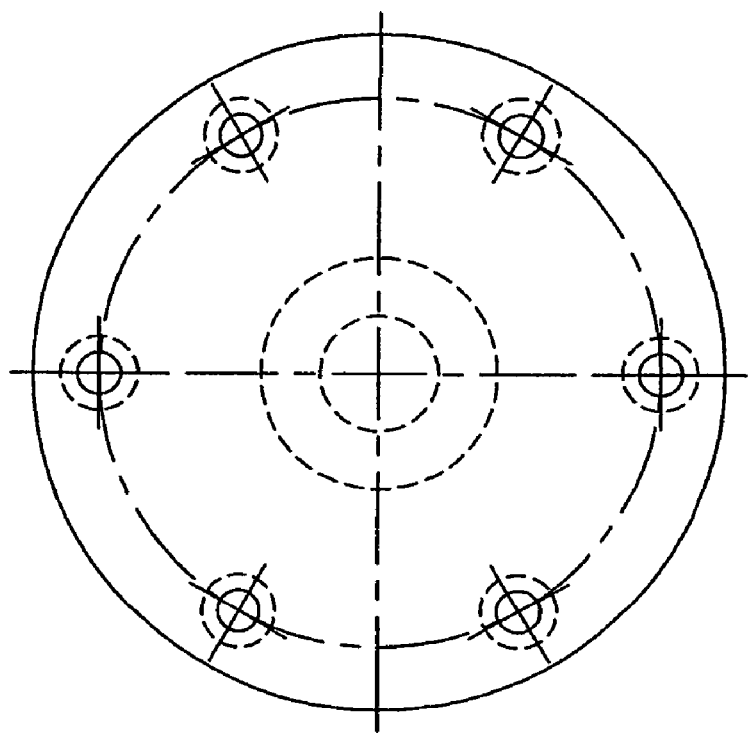
Figure 7D:
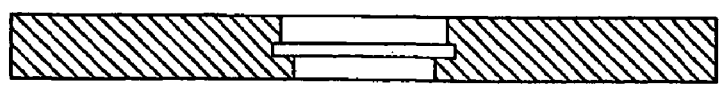

FIG. 6 shows the Sample Chamber with the different component parts a–E assembled together. The individual parts are described in detail in FIG. 7A-E.

Assembling the Set-Up for Fluorescence Experiment

FIG. 7(A-E) shows a first embodiment of an assembly used for the fluorescent experiments Part A containing on the side a hole of several millimeters in diameter (not shown) is put up side down on the table. Part B is put inside taking care to align screw holes of parts A and B. Two o-rings are inserted in part B. The membrane is put in place. The membrane is mounted on a plastic support of 0.1 mm thickness. The diameter of the plastic support has to be chosen between the two diameters of the o-rings used. The hole of 3 mm diameter was previously preformed in the middle of the plastic support, this is the region where the membrane is free. A TEM grid is stuck on one side (the external one) of the membrane, in its middle. Part C is then inserted. It is important that the horizontal canal is aligned with the side hole of part A. The 6 screws are inserted. The membrane, parts A, B and C are screwed together. The sample is then ready to be filled with water, or any other aqueous medium. The liquid medium is deposited inside the free space in the middle of part C (while it is still upside down). A thin pin (0.1 mm diameter) is inserted through the hole practiced on the sides of part A and C. The pin is inserted deep inside, until its extremity reaches the wet chamber. The other extremity of the pin goes outside. The last o-ring is put in its place in part C. (At this stage the o-ring cannot be put in place completely, because the pin is there, just below. This is normal and useful for the following steps). Part D (containing in the middle the lens to collimate the light—not shown) is put in the assembly. The inner side of the lens is wet by the medium filling the chamber. Finally Part E is inserted. When turning Part E inside the assembly, the part D (with the lens) is pressed progressively on the o-ring (of Part C). Since the o-ring is not completely in place because of the pin, it does not isolate yet the chamber from the outside. When screwing Part E, the volume of the wet chamber is decreased, thus the medium in excess can flow out below the o-ring, in close proximity to the pin. Usually, some droplets flow out from the canal in Part C. When the o-ring is pressed enough, and the lens is correctly placed, the pin is slowly pulled out. At that stage of the assembly, the o-ring in part B is free to occupy all the space. It comes to its natural position where it is sealing the chamber. Thus, the chamber is finally completely sealed at that stage. This assembly (Parts A to E) is then turned to its normal position (up-side up) and inserted inside the microscope stage specially designed for it.

Figure 8A:
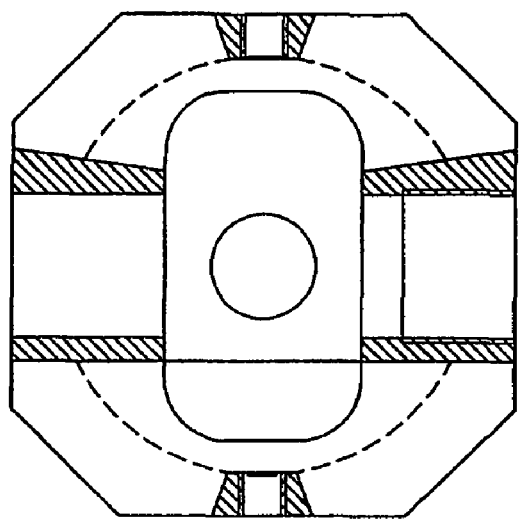
FIGS. 8A and 8B is a diagram of the microscope stage adapter for use with the chamber.
Figure 8B:
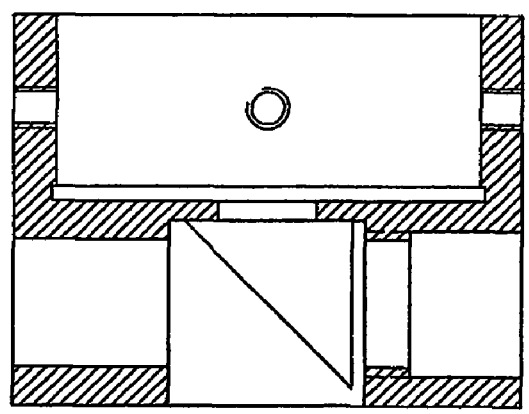

FIG. 8, consisting of FIGS. 8A and 8B, shows a microscope stage suitable for use with the assembly. The top cavity of the stage (2) is the recess into which the Sample Chamber is inserted. Just below it is a prism. The prism (1) is used to redirect the light in the direction of a hole. In this hole, a lens (not shown) focuses the light at the entrance of an optical fiber.

Figure 9:
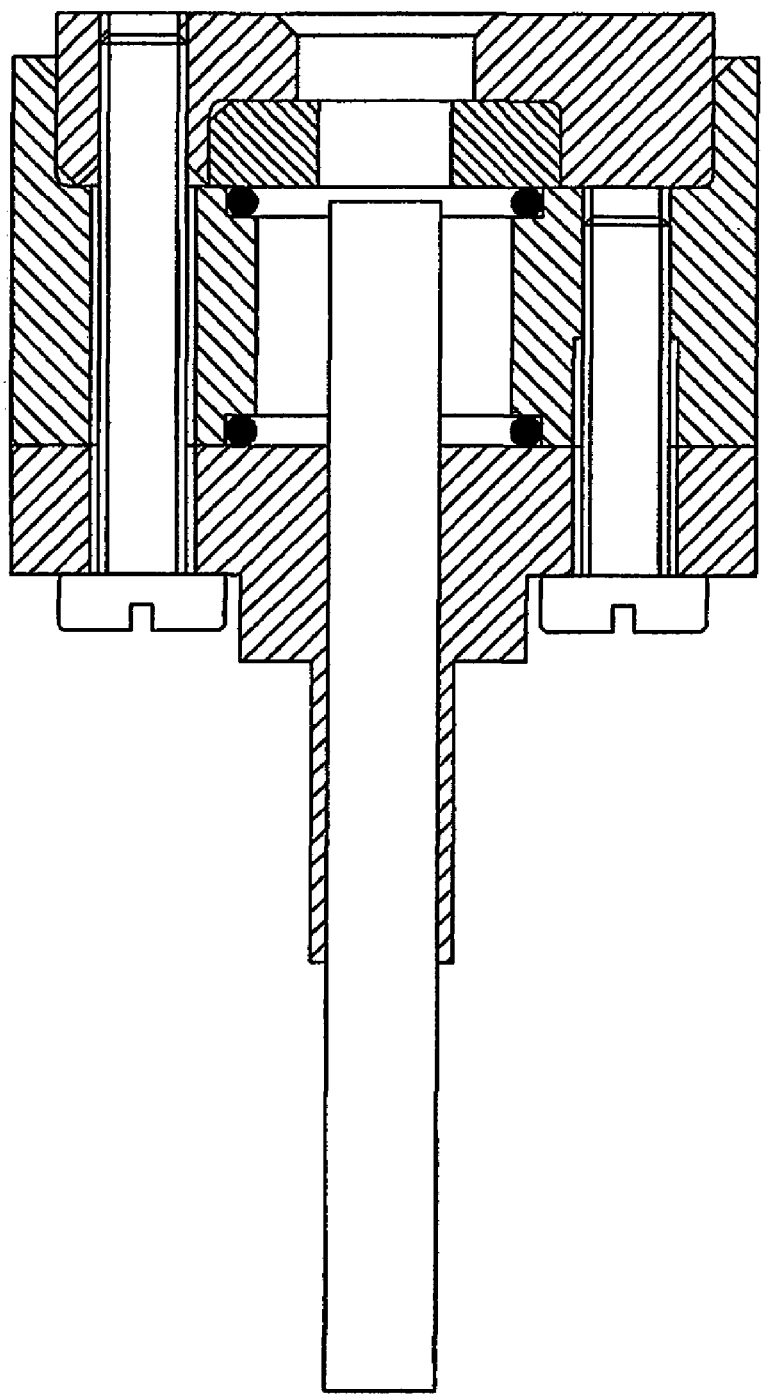
FIG. 9 is a diagram of an alternate embodiment for luminescence.

In order to get better light collection efficiency, an alternative setup was designed where a direct coupling between the biological sample and a light guide is established. This alternative setup is shown in FIG. 9. It contains a vacuum tight chamber with a light going directly from the sample region to the single photon detector setup described above. In this drawing the housing (1), is attached to the support (2), and a cover (3); using screws (6.7), within is situated a cavity disk (4), with the membrane (9), further connected to the light guide (5), sealed with the o-rings (8).

Labeling Techniques.

The current invention is suitable for imaging cell components in either the intracellular or the extracellular parts of a cell.

Different approaches can be considered to label intracellular parts of a cell:

If the cells can be used after fixation, the common methods involve permeabilization or extraction of the cell membrane.

An alternative approach, which is suitable to living cells, is to insert the markers through a pinocytotic reaction. The cells can thereafter be fixed or observed while they are alive. The pinocytotic reaction preserves viability of the cell if it is performed under the appropriate conditions. It allows inserting molecules (fluorescent markers in most of the applications known in the art) or nanoscale particles (as particularly suitable for the present application). Some researchers have reported success in introducing beads on the micron scale inside cells also.

Permeabilization and extraction procedures are suitable for fixed cells. Several procedures can be adopted, depending if the operator want to remove completely the cell membrane or just create some pores.

Extraction and fixation means that the external membrane of the cell is first completely removed. Then, immediately after, the cell is fixed. This kind of procedure is good for visualizing structures in the cytoplasm, the nucleus or the cytoskeleton.

Fixation and permeabilization means the cells are fixed first and further, the cell membrane is made permeable.

Pinocytotic reaction is suitable for living cells. For example one can use an agent such as the commercially available Influx (Molecular Probes I-14402 to introduce particles inside the cells. The Influx cell-loading technique is based on the osmotic lysis of pinocytotic vesicles. Briefly, compounds to be loaded are mixed at high concentration with a hypertonic medium, allowing the material to be carried into the cells via pinocytotic vesicles. The cells are then transferred to a hypotonic medium, which results in the release of trapped material from the pinocytotic vesicles within the cells, filling the cytosol with the compounds.

Following the protocols given by Molecular Probes we introduced Colloidal Gold, hundred nanometer size gold particles, fluorescent beads on the micron scale, and quantum dots inside cells. The cells can be fixed and gold or silver enhanced prior to observation. When using this method a certain percentage of the cells die. In most of the experiments performed, no more than 10–20% of the cells were lost.

Cell surface of living cells can be labeled with gold particles with low damage to the cells. An exemplary protocol developed for use in conjunction with the present invention utilizes streptavidin-biotin labeling methods as are known in the art. The idea is to incubate the cells with biotin that will attach to a certain percentage of the proteins on the cell surface. Then, the cells are incubated with streptavidin linked to gold particles that will attach to the biotin. The dosage of biotin for incubation must be carefully controlled, since too much biotin on the membrane protein may perturb their activity and induce cell death. Different studies have shown biotin can be used for cell tracking applications. Several studies dealt with red blood cells (e.g., Hoffmann-Fezer et al., Annals of Hematology, 74, 231–238, 1997; Ault, K. A. and C. Knowles, Exp Hematology, 23, 996–1001, 1995, and references therein). Biotin labels many cells with little or no change in their biology and permits both their detection and their recovery if needed.

Microcolumns. A further development that will increase throughput is parallel inspection with microcolumns. The microcolumns are miniature scanning electron microscopes that are produced by integrated silicon processes. Due to their size, the microcolumns can operate in parallel; considerably reducing the scanning time and the bulkiness of a SEM based system. Further details of the microcolumns are given in Feinerman and Crewe "Miniature Electron Optics", Advances in Imaging and Electron Physics, Vol. 102, 187 (1998) as well as U.S. Pat. No. 5,122,663, the contents of which are hereby incorporated by reference as if fully disclosed herein. This idea of utilizing microcolumns-based electron microscopes in biological applications is described at length in the copending PCT application, entitled "Method of identification and quantification of biological molecules and apparatus therefore" (PCT/IL01/00764).

The following examples of the principles of the present invention are provided solely for illustrative purposes intended to be construed in a non-limitative fashion.

EXAMPLES

Growing Cells on the Partition Membrane

The following are exemplary procedures for growing cells on the membrane given as nonlimiting examples. The polyimide partition membranes are first coated with fibronectin (0.1 mg/ml) for 15 minutes. After washing with PBS and culture medium, cells are plated in the usual ways at concentrations of 800–1500 cells in 12–15 µl per chamber. After 24 hours cells are ready for manipulation/labeling. Most cell types can grow on the partition membrane itself without the support of an additional matrix like fibronectin, but under such conditions they would be more likely to be washed off during the extensive washing procedures. The viability of the cells is not affected by any of these procedures.

The current invention is compatible with both adherent and non-adherent cells (as exemplified hereinbelow). For the purpose of imaging non-adherent cells (lymphocytes for example), cells are first labeled in suspension, and then allowed to adhere for 30 minutes onto a partition membrane pre-treated with 0.4% poly-lysine for 1–3 hours.

Minimizing Radiation Damage

Currently we exemplify image dynamics of undisturbed processes only on a short time scale (seconds). One kind of radiation damage that needs to be taken care is the damage produced by free radicals formed by the electron beam hitting the water molecules.

One possible strategy against such damage is to include additives to the medium of the cells that would absorb free radicals produced by the radiation, thereby minimizing the radiation damage to the cells. Any known compounds suitable for radical scavenging may be used as long as it is non-toxic to the cells. One exemplary candidate for such an additive is sucrose, which has been identified as a free radicals absorber. This solution is only possible with the current invention since conventional electron beam technology does not work in a wet environment.

Cell Labeling by Immunolabeling

Labeling cells is done by the regular immunolabeling procedures. Cells were washed, and optionally fixed by 2% paraformaldehyde for 7 minutes. Following blocking with the appropriate serum, cells were incubated with a specific mono or polyclonal antibody for 1 hour. After washing, the samples are incubated with a second antibody that recognizes the first specific antibody. This second antibody is linked to a 5, 10, 20 or 40 nm gold cluster. The gold labeling may then be further amplified by silver enhancement, using conditions carefully calibrated for each colloid.

Fixed Wet Cell Under the Partition Membrane

Growth Factor Receptors Labeled on Fixed A431 Cells and C2C12 Mouse Myoblasts.

Figure 10A:
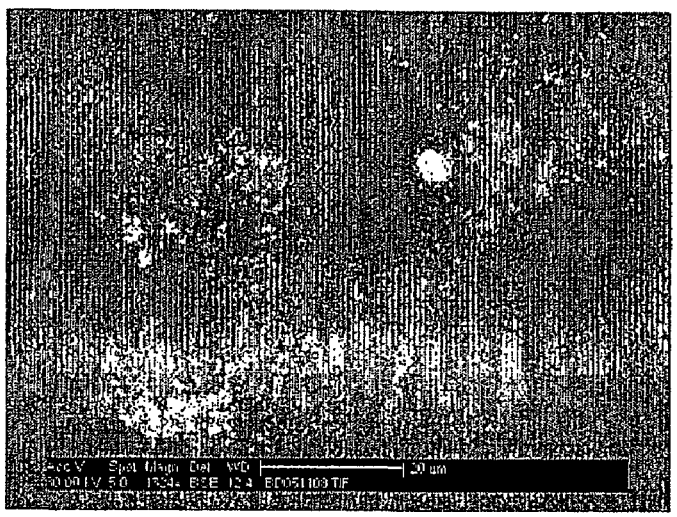
FIGS. 10A–E shows images of fixed wet cells under the partition membrane.

Cells were fixed with 2% paraformaldehyde and labeled with anti FGF receptor monoclonal antibody (on C2C12 myoblasts) or anti-EGF monoclonal antibody (A431 cells) followed by anti mouse IgG linked to 20 nm-diameter gold colloids. The cells were fixed, and silver enhancement was used to increase the size of the labeling particles. An XL30 ESEM was used for imaging and the cells were examined with the backscattered electrons (BSE) mode. The FGF receptor gold labeling can be seen as bright spots on both cells shown in FIG. 10A. The EGF receptors are visible on the A431 cells of FIGS. 10B–D. The fuzziness of the labeling around the nucleus area is the result of topographic differences between the gold particles. Gold labeling close to the partition membrane is clear and in focus, while the more distal labeling beyond and around the nucleus is fuzzy. The fuzziness of the labels in the region of the nucleus is evidence for the fact that the labels in this region are further away from the partition membrane. This fuzziness actually provides a tool for the determination of the distance of the labels from the plane of the partition membrane hence providing three-dimensional information. Using image analysis algorithms that are capable of deconvoluting the effect of the additional medium between the partition membrane and the labels can provide a rather accurate estimation of this distance.

To achieve a higher resolution image of labels on the distal side of the cell (opposite to side attached to the membrane substratum) another chamber design can be applied. In such a design the cells are grown on a flat platform with only a thin layer of liquid covering them. Then the partition membrane is placed on top of that platform covering the cells. In this way the top side of the cell is imaged and the cells are still in wet environment.

Live Non-Labeled Adherent Cells Under the Membrane

Live C2C12 mouse myoblasts.

Figure 12:
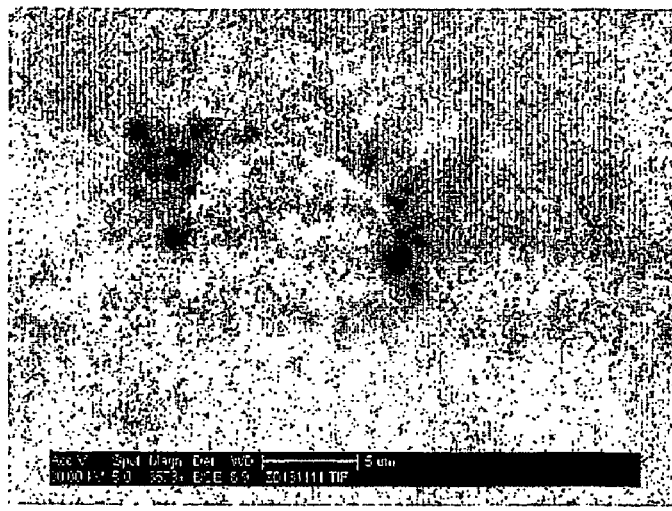
FIG. 12 is an image of intact unlabelled CHO cells under the membrane.

Cells were plated on fibronectin in their normal culture medium. After 24 hours the cells were examined with the BSE mode. The live C2C12 cells (FIG. 11A-D) and CHO cells (FIG. 12) show clearly the outline of the cell and its nucleolus as well as some sub-nuclei organelles.

The IL-2 Receptor Alpha Labeled on Jurkat Human Lymphocyte

Figure 10B:
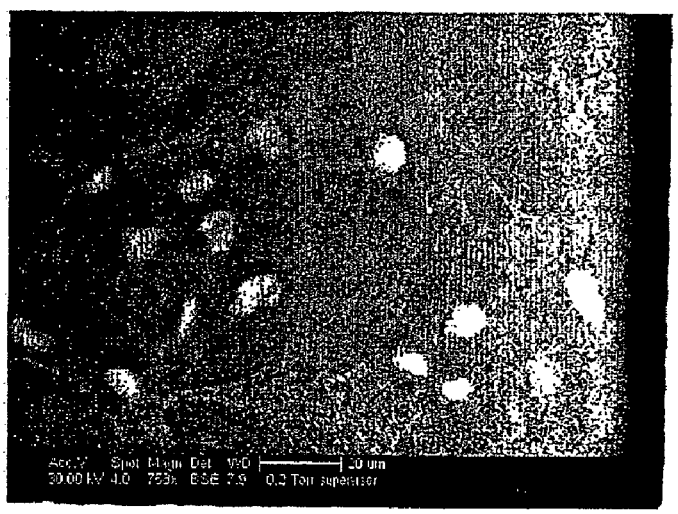
Figure 10C:
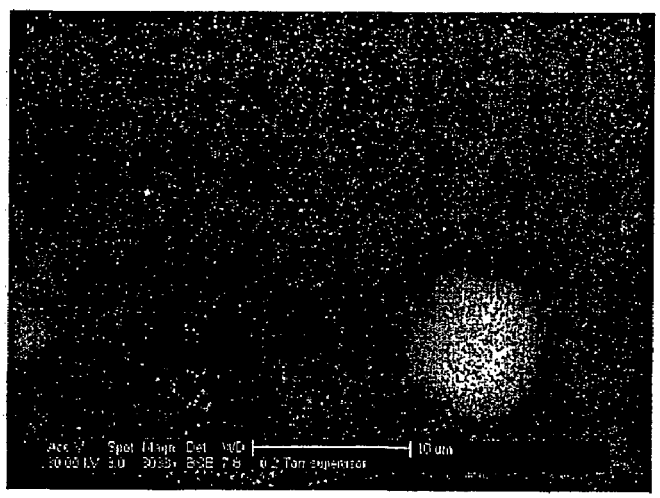
Figure 10D:
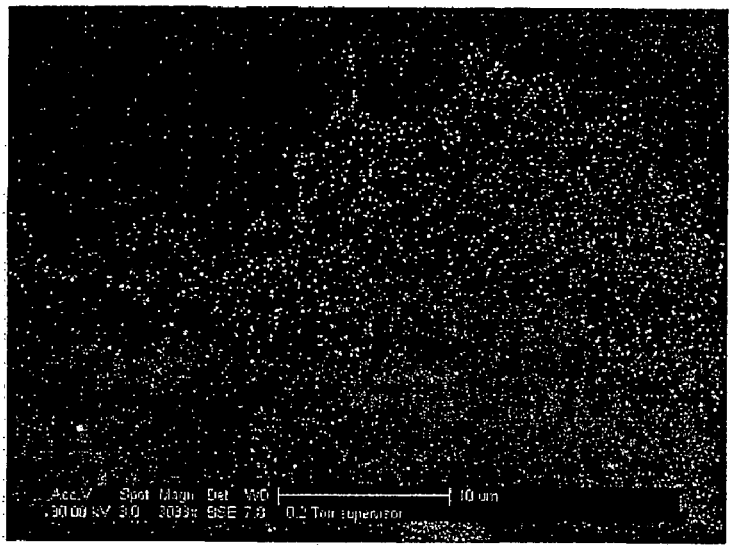
Figure 10E:
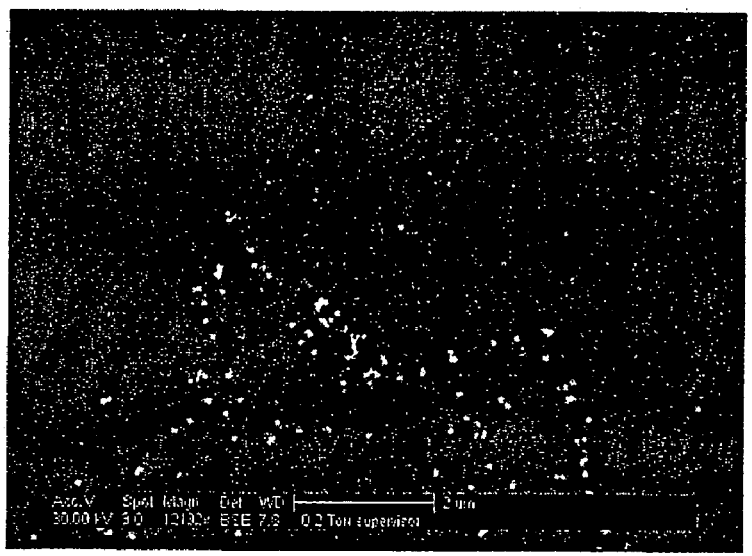
Figure 11A:
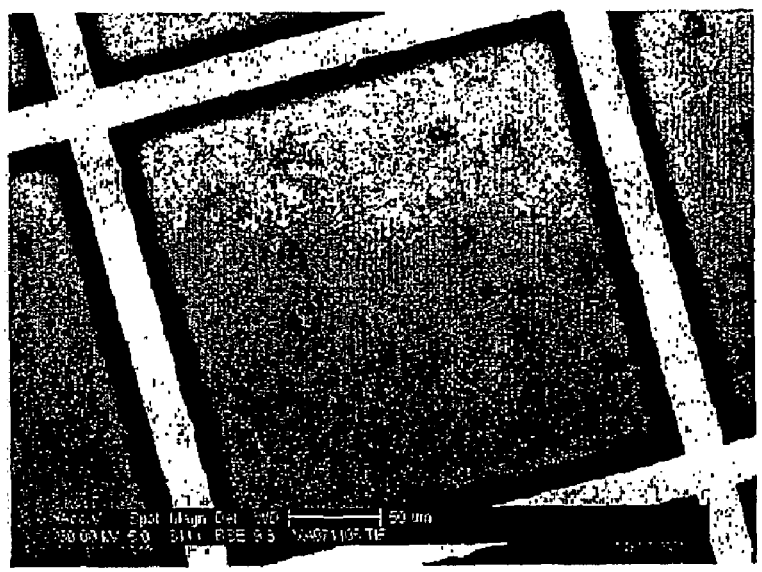
FIGS. 11A–D show images of live non-labeled adherent cells under the membrane.
Figure 11B:
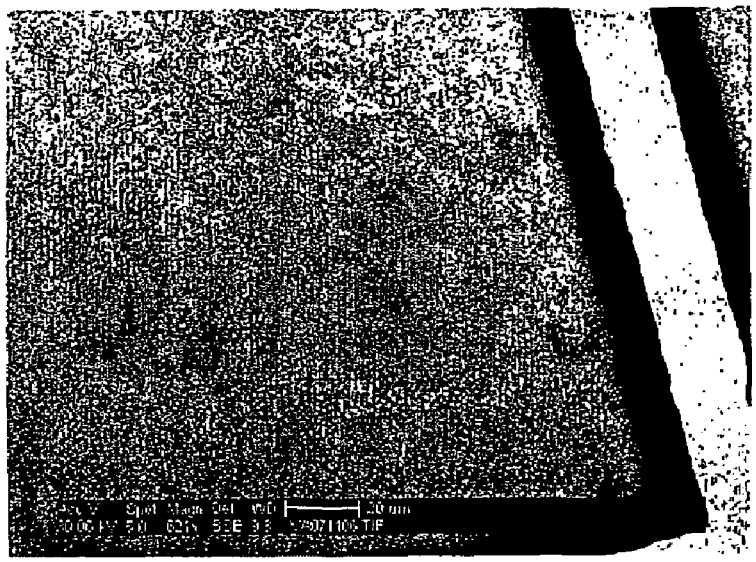
Figure 11C:
Figure 11D:
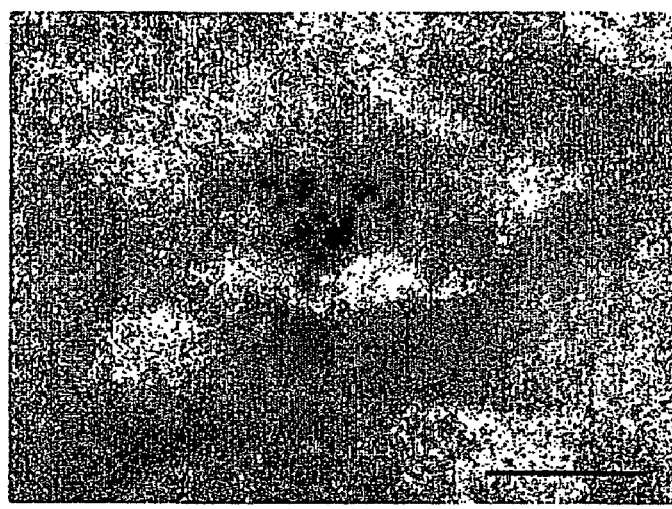
Figure 13:
FIG. 13 an image of live non-adherent cell under the membrane.

Cells were labeled with anti human IL-2 receptor monoclonal antibody followed by anti mouse IgG linked to 20 nm-diameter gold colloids. The cells were allowed to adhere onto a polylysine pre-coated partition membrane for 30 minutes and then examined with the BSE mode. FIG. 13 shows in and out of focus gold labeling resulting from topographic differences between the gold particles as previously seen in the FGF receptor labeling of fixed C2C12 (FIG. 10A), and EGF receptor labeling of A431 cells (FIGS. 10B–D).

Images Taken with this Cathodoluminescence (CL) Setup.

Even though the signal is rather weak (probably due to poor light collection efficiency), the cells are clearly observed. The cells are observed even without CL markers (i.e. some parts of the cell are autoluminescent). With CL markers and with improved collection efficiency much higher resolution is expected.

Cathodoluminescence image of fixed cells NIH3T3.

Figure 14A:
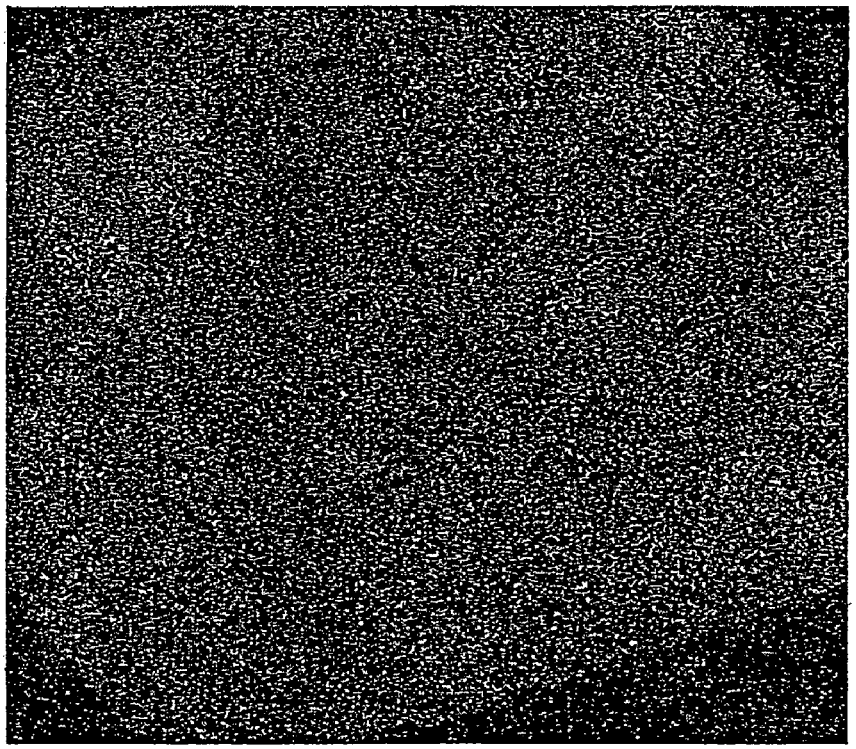
FIGS. 14A–C shows cathodoluminescence images of fixed NIH3T3 cells.
Figure 14B:
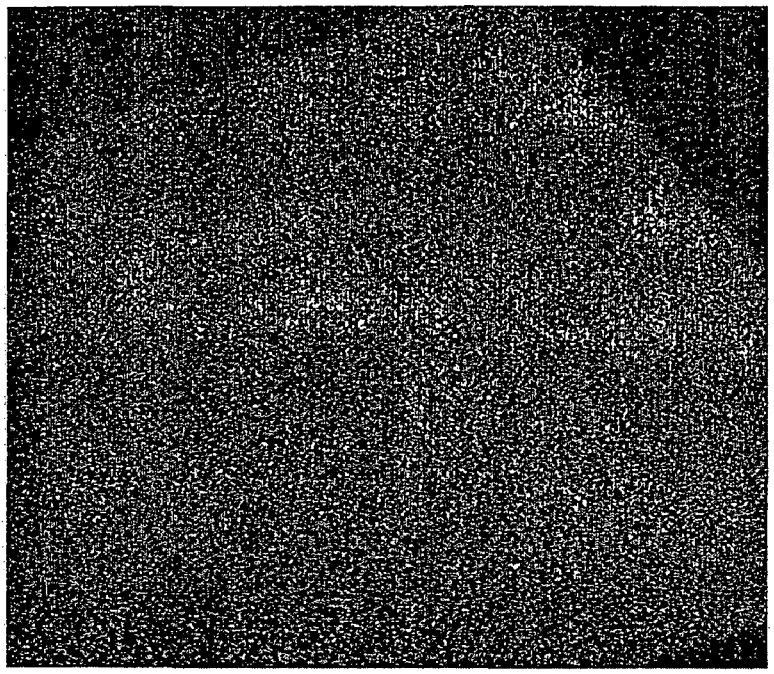
Figure 14C:
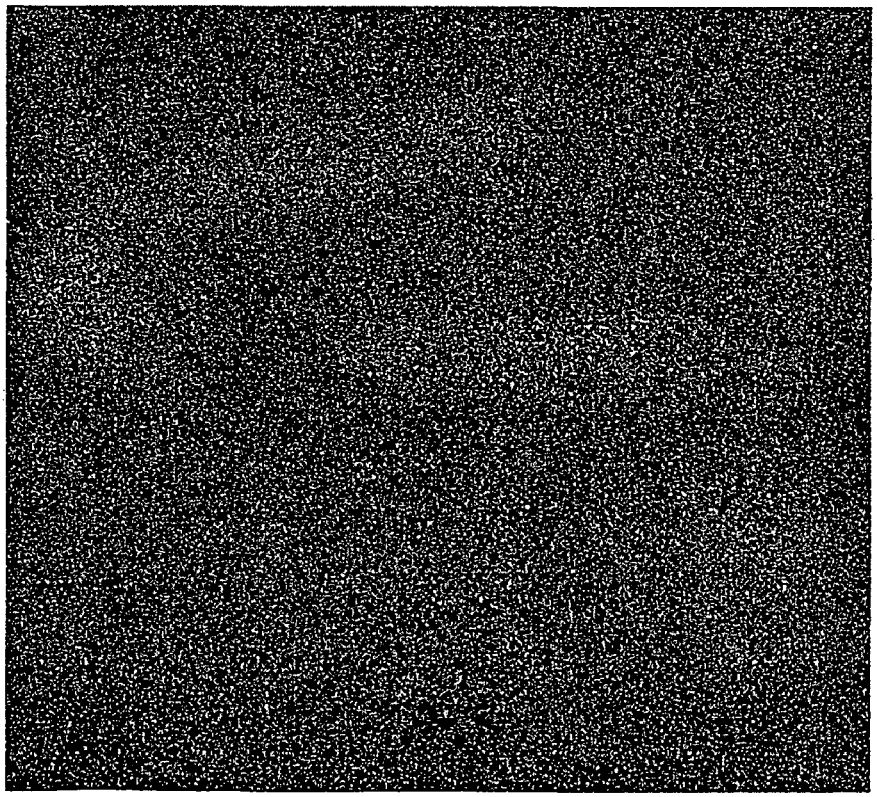

No luminescent markers were inserted in the cells. Thus the light emitted results from the 'natural' cathodoluminescence of the cells, as shown in FIGS. 14 A–C. The cell width is about 20 microns.

Biotin-Based Labeling on NIH3T3 Cells:

Materials:

Sulfo-NHS-LC-biotin (Sigma B1022) (dissolve 10 mg/ml in DMSO and keep at 4° C.).

Streptavidin linked to gold particles of diameter 10 nm to 40 nm

Phosphate buffered physiological saline (PBS) pre warmed at 37° C.

Culture Medium for the cell line (pre warmed at culture temperature for the cell line).

Serum free medium pre warmed.

Solutions to Prepare:

solution A: Sulfo-NHS-LC-biotin at 0.5 mg/ml in prewarmed PBS. Solution has to be made just prior to use since degradation occurs in water.

solution B: Streptavidin gold dissolved (1/10 to 1/100) in PBS + serum free medium (1 to 5 volume ratio).

solution C: full medium—PBS solution (1 to 5 volume ratio).

Figure 15:
FIG. 15 is an image of intact NIH3T3 cells.

Procedure:
1. trypsinization of the cells.
2. centrifugation at 1250 t/min for 4 minutes.
3. remove supernatant and resuspend in 10 ml fresh medium
4. take 3 ml divided in two 1.5 ml eppendorf tubes.
5. centrifugation 1600 t/min for 3 minutes.
6. remove as much as possible the supernatant.
7. gently add PBS at 37 degrees to obtain 1.5 ml in the tubes (washing). Resuspend cells.
8. centrifuge again for 3 minutes.
9. remove PBS and add biotin (solution A) Resuspend the cells and mix well but gently.
10. incubate at 37 degrees for 20 minutes (shaking every 3 min)
11. centrifuge
12. remove supernatant and resuspend in 1.5 ml of fresh medium.
13. transfer to petri dishes or membranes and incubate for few hours to overnight.
14. wash 1–2 times with PBS.
15. Incubate with Solution B for one hour and mix sometimes if possible.
16. wash 1–2 times with PBS.
17. remove PBS and replace by solution C.
18. Proceed to observation in the electron microscope Living NIHT3 Cells. The cells surface proteins were biotinylated and linked to Steptavidin attached to 40 nm gold particles, as shown in FIG. 15.

It will be appreciated by persons skilled in the art that the present invention is not limited to what has been particularly shown and described hereinabove. Rather, the scope of the present invention includes both combinations and subcombinations of the various features described hereinabove as well as variations and modifications thereof which would occur to persons skilled in the art upon reading the foregoing description and which are not in the prior art.

What is claimed is:

1. A scanning electron microscope assembly comprising:
   a scanning electron microscope providing a beam of electrons to a specimen region maintained at a pressure below the vapor pressure of water;
   a specimen enclosure assembly disposed in the specimen region at a pressure below the vapor pressure of water and comprising:
   a rigid specimen enclosure having an aperture and defining an enclosed specimen placement volume; and
   an electron beam permeable, fluid impermeable, vacuum tolerant cover sealing said specimen placement volume at said aperture from a volume outside said enclosure.

2. A scanning electron microscope assembly according to claim 1 and wherein said cover is formed from a material selected from the group consisting of: polyimide, polyamide, polyamide-imide, polyethylene, polypyrrole, PARLODION, COLLODION, KAPTON, FORMVAR, VINYLEC, BUTVAR, PIOLOFORM, silicon dioxide, silicon monoxide and carbon.

3. A scanning electron microscope assembly according to claim 1 and also comprising an apertured mechanical support for said cover, which defines openings having at least one dimension of no less than 100 microns.

4. A scanning electron microscope assembly according to claim 1 and wherein said enclosure is constructed and configured so as to prevent transmission of electron beams through said specimen enclosure assembly while permitting impingement of electrons into said specimen placement volume and reflection of said electrons from locations within said specimen placement volume.

5. A scanning electron microscope assembly according to claim 1 and wherein said enclosure and said cover are constructed and configured so as to ensure a specimen is engaged with said cover.

6. A scanning electron microscope assembly according to claim 1 and wherein said cover generally is gas impermeable up to at least a pressure gradient of one atmosphere.

7. A scanning electron microscope assembly according to claim 1 and wherein said enclosed specimen placement volume has dimensions all of which exceed 10 microns and defines an aperture communicating with said enclosed specimen placement volume.

8. A scanning electron microscope assembly according to claim 1 and wherein said cover generally is permeable to electrons having energies in excess of 2 KeV.

9. A scanning electron microscope assembly according to claim 1 and also comprising a pressure relief device communicating with said enclosed specimen placement volume.

10. A scanning electron microscope assembly according to claim 1 and also comprising a light collector operative to collect light generated from an interaction between electrons and a specimen at a location within said enclosed specimen placement volume.

* * * * *

UNITED STATES PATENT AND TRADEMARK OFFICE
CERTIFICATE OF CORRECTION

PATENT NO. : 6,989,542 B2
DATED : January 24, 2006
INVENTOR(S) : Elisha Moses et al.

It is certified that error appears in the above-identified patent and that said Letters Patent is hereby corrected as shown below:

<u>Title page,</u>
Item [75], Inventors, delete "Ory Zik, Tel Aviv (IL)" and insert -- Ory Zik, Brooline, MA --.

Signed and Sealed this

Second Day of May, 2006

JON W. DUDAS
*Director of the United States Patent and Trademark Office*